US009666058B2

(12) United States Patent
Kalokitis et al.

(10) Patent No.: US 9,666,058 B2
(45) Date of Patent: May 30, 2017

(54) APPARATUS AND METHOD FOR MONITORING AND CONTROLLING DETECTION OF STRAY VOLTAGE ANOMALIES

(71) Applicant: Power Survey LLC, Kearny, NJ (US)

(72) Inventors: David Kalokitis, Robbinsville, NJ (US); Leonard Joshua Schultz, Holland, PA (US); Christos Alkiviadis Polyzois, Bloomington, MN (US); Vincent Paragano, Yardley, PA (US)

(73) Assignee: Power Survey LLC, Kearny, NJ (US)

( * ) Notice: Subject to any disclaimer, the term of this patent is extended or adjusted under 35 U.S.C. 154(b) by 0 days.

(21) Appl. No.: 14/829,156

(22) Filed: Aug. 18, 2015

(65) Prior Publication Data
US 2015/0356855 A1   Dec. 10, 2015

Related U.S. Application Data

(63) Continuation of application No. 14/828,062, filed on Aug. 17, 2015, which is a continuation of application
(Continued)

(51) Int. Cl.
G08B 21/00 (2006.01)
G08B 21/18 (2006.01)
(Continued)

(52) U.S. Cl.
CPC ............ *G08B 21/182* (2013.01); *G01C 7/04* (2013.01); *G01R 19/0007* (2013.01);
(Continued)

(58) Field of Classification Search
CPC combination set(s) only.
See application file for complete search history.

(56) References Cited

U.S. PATENT DOCUMENTS 3,309,690 A    3/1967  Moffitt
3,546,587 A   12/1970  Turecek
(Continued)

FOREIGN PATENT DOCUMENTS

DE        4428336 A1    12/1994
JP      S 62103596 A     5/1987
WO      WO-9933514 A1    7/1999

OTHER PUBLICATIONS

Brigham, "The Fast Fourier Transform", Prentice-Hall, Inc., 1974, 12 pages.
(Continued)

*Primary Examiner* — Travis Hunnings
(74) *Attorney, Agent, or Firm* — Moser Taboada

(57) ABSTRACT

Apparatus and methods for detecting stray voltage anomalies in electric fields are provided herein. In some embodiments, an apparatus for detecting an electrical field may comprise: at least one sensor probe for generating data corresponding to an electrical field detected by the at least one sensor probe, wherein the at least one sensor probe comprises at least one electrode; a processor, coupled to the at least one sensor probe, for analyzing the data to identify a voltage anomaly in the electric field; and an indicator, coupled to the processor, for alerting a user to a presence of the voltage anomaly in the electric field.

20 Claims, 18 Drawing Sheets

Related U.S. Application Data

No. 14/095,771, filed on Dec. 3, 2013, now Pat. No. 9,110,120, which is a continuation of application No. 12/321,484, filed on Jan. 21, 2009, now Pat. No. 8,598,864, which is a continuation-in-part of application No. 11/551,222, filed on Oct. 19, 2006, now Pat. No. 7,486,081, which is a continuation-in-part of application No. 11/224,909, filed on Sep. 13, 2005, now Pat. No. 7,248,054.

(60) Provisional application No. 60/728,168, filed on Oct. 19, 2005, provisional application No. 60/639,054, filed on Dec. 23, 2004, provisional application No. 60/641,470, filed on Jan. 5, 2005.

(51) Int. Cl.
| | |
|---|---|
| G01R 31/02 | (2006.01) |
| G01R 29/12 | (2006.01) |
| G01C 7/04 | (2006.01) |
| G01R 19/00 | (2006.01) |
| G01R 19/155 | (2006.01) |
| G01R 29/08 | (2006.01) |

(52) U.S. Cl.
CPC ....... *G01R 19/155* (2013.01); *G01R 29/0814* (2013.01); *G01R 29/12* (2013.01); *G01R 31/02* (2013.01)

(56) References Cited

U.S. PATENT DOCUMENTS

| | | | |
|---|---|---|---|
| 3,662,260 A * | 5/1972 | Thomas | G01R 29/0878 324/344 |
| 3,761,803 A | 9/1973 | Slough | |
| 3,774,108 A | 11/1973 | Ogilvie | |
| 3,774,110 A | 11/1973 | Roveti | |
| 3,786,468 A | 1/1974 | Moffitt | |
| 3,820,095 A | 6/1974 | Wojtasinski et al. | |
| 3,878,459 A | 4/1975 | Hanna | |
| 4,007,418 A | 2/1977 | Hanna | |
| 4,101,825 A | 7/1978 | Truax | |
| 4,277,745 A | 7/1981 | Deno | |
| 4,349,783 A | 9/1982 | Robson et al. | |
| 4,359,926 A | 11/1982 | Sano et al. | |
| 4,588,993 A | 5/1986 | Babij et al. | |
| 4,714,915 A | 12/1987 | Hascal et al. | |
| 4,716,371 A | 12/1987 | Blitshteyn et al. | |
| 4,724,393 A | 2/1988 | Kumada et al. | |
| 4,758,792 A | 7/1988 | Polonis et al. | |
| 4,791,517 A | 12/1988 | Park | |
| 4,983,954 A | 1/1991 | Huston | |
| 5,001,465 A | 3/1991 | Siegel | |
| 5,148,110 A | 9/1992 | Helms | |
| 5,164,673 A | 11/1992 | Rosener | |
| 5,315,232 A | 5/1994 | Stewart | |
| 5,350,999 A | 9/1994 | Brunda | |
| 5,646,525 A | 7/1997 | Gilboa | |
| 5,859,597 A | 1/1999 | Cornelio et al. | |
| 5,952,820 A | 9/1999 | Thrasher et al. | |
| 6,002,348 A | 12/1999 | Greene et al. | |
| 6,008,660 A | 12/1999 | Mahlbacher | |
| 6,087,826 A | 7/2000 | Donath | |
| 6,100,806 A | 8/2000 | Gaukel | |
| 6,154,178 A | 11/2000 | Aslan | |
| 6,229,446 B1 | 5/2001 | Lloyd-Jones et al. | |
| 6,230,105 B1 | 5/2001 | Harris et al. | |
| 6,242,911 B1 | 6/2001 | Maschek | |
| 6,317,683 B1 | 11/2001 | Ciprian et al. | |
| 6,329,924 B1 | 12/2001 | McNulty | |
| 6,375,622 B1 * | 4/2002 | Kao | A61B 5/0482 600/300 |
| 6,411,103 B1 | 6/2002 | Tobias et al. | |
| 6,414,492 B1 | 7/2002 | Meyer et al. | |
| 6,631,063 B2 | 10/2003 | Ortiz et al. | |
| 6,788,215 B1 | 9/2004 | White | |
| 6,859,141 B1 | 2/2005 | Van Schyndel et al. | |
| 7,141,968 B2 | 11/2006 | Hibbs et al. | |
| 7,253,642 B2 | 8/2007 | Kalokitis et al. | |
| 7,283,055 B2 | 10/2007 | Didik | |
| 2002/0049063 A1 | 4/2002 | Nohara et al. | |
| 2003/0071628 A1 | 4/2003 | Zank et al. | |
| 2003/0117943 A1 | 6/2003 | Sakata et al. | |
| 2004/0103409 A1 | 5/2004 | Hayner et al. | |
| 2005/0122118 A1 * | 6/2005 | Zank | G01D 9/005 324/457 |
| 2006/0027404 A1 | 2/2006 | Foxlin | |
| 2006/0139031 A1 | 6/2006 | Kalokitis et al. | |
| 2006/0139032 A1 | 6/2006 | Kalokitis et al. | |
| 2007/0179737 A1 | 8/2007 | Kalokitis et al. | |
| 2007/0194878 A1 | 8/2007 | Touge et al. | |
| 2007/0279067 A1 | 12/2007 | Wiswell et al. | |

OTHER PUBLICATIONS

"IEEE Standard Procedures for Measurement of Power Frequency Electric and Magnetic Fields From AC Power Lines", IEEE Std 644-1994, 1994.

Tandler, "12. Measurement of Low Frequency Electrical and Magnetic Fields", EMF Congress, pp. 1-24, 29 Mar. 1995.

"A Sensor System for Detecting Stray Voltages on Covers, Grates, Light Poles and Other Structures," Sarnoff Corporation, 23 Pages, 2002.

Farrell et al., "Electric and magnetic signatures of dust devils from the 2000-2001 MATADOR desert tests", vol. 109, Issue E3, Mar. 2004.

"EFA-200/-300 EM Field Analyzer Operating Manual", Narda Safety Test Solutions. 211 Pages, 2005.

International Search Report and Written Opinion dated Sep. 13, 2010 for PCT Application No. PCT/US2010/021653.

International Search Report and Written Opinion dated Aug. 29, 2008 for PCT Application No. PCT/IB06/04314.

Exhibit 1020 from IPR2014-00832 (Declaration of Dr. Robert G. Olsen dated May 28, 2014).

Institution Denial Decision of Inter Partes Review dated Nov. 14, 2014—from IPR2014-00832.

Patent Owner Preliminary Response dated Sep. 11, 2014—from IPR2014-00832.

Petition for Inter Partes Review dated May 30, 2014—from IPR2014-00832.

Power Survey, LLC Updated Exhibit List dated Feb. 20, 2015—from IPR2014-00832.

Exhibit 2200 from IPR2014-00834 (Stray (Contact) Voltage Sensor Report dated Apr. 15, 2010).

Exhibit 2203 from IPR2014-00834 (Patent Owner's Objections to Petitioner's Evidence dated Dec. 11, 2014).

Exhibit 2204 from IPR2014-00834 (Deposition of Robert Johnson dated Jan. 29, 2015).

Exhibit 2205 from IPR2014-00834 (Deposition of Robert Eugene Johnson dated May 27, 2015).

Exhibit 2206 from IPR2014-00834 (Supplemental Declaration of Andrew W. Carter dated Mar. 12, 2015).

Exhibit 2207 from IPR2014-00834 (Supplemental Declaration of David W. Fugate dated Mar. 12, 2015).

Decision—Denial of Inter Partes Review dated Nov. 14, 2014—from IPR2014-00835.

Patent Owner Preliminary Response dated Sep. 11, 2014—from PR2014-00835.

Patent Owner Response dated Feb. 20, 2015—from PR2014-00836.

Petitioners' Response to Patent Owner's Motion for Observation on Cross Examination of Petitioners' Reply Witness Mr. Robert Johnson dated Jun. 16, 2015—from PR2014-00836.

Patent Owner Preliminary Response dated Sep. 11, 2014—from PR2014-00836.

Petitioners' Corrected Reply dated May 12, 2015—from PR2014-00836.

Final Written Decision dated Nov. 23, 2015—from PR2014-00836.

(56) References Cited

OTHER PUBLICATIONS

Decision—Denial of Inter Partes Review dated Nov. 14, 2015—from IPR2014-00838.
Exhibit 1011— from 2014-00838 (Deposition of Dr. David W. Fugate dated Apr. 30, 3014).
Exhibit 1012 from IPR2014-00838 (Deposition of David Kalokitis dated Apr. 18, 2014).
Exhibit 1018 from IPR2014-00838 (Declaration of Dr. Robert G. Olsen dated May 28, 2014).
Exhibit 2001 from IPR2014-00838 (Certificate of Mailing—Supplemental Information Disclosure Statement—dated Dec. 8, 2005).
Patent Owner Preliminary Response dated Sep. 11, 2014—from IPR2014-00838.
Petition for Inter Partes Review dated May 30, 2014—from IPR2014-00838.
Petitioners' Corrected Reply dated May 12, 2015—from IPR2014-00839.
Exhibit 1047 from IPR2014-00839 (Public Power Magazine—Undergrounding Gains Control—dated May 23, 2014).
Exhibit 1027 from IPR2014-00839 (Declaration of Robert Johnson dated May 12, 2015).
Exhibit 1032 from IPR2014-00839 (Form Confirmation dated Apr. 26, 2001).
Exhibit 1037 from IPR2014-00839 (Stray Voltage Detection Final Report dated Jun. 14, 2002).
Exhibit 1035 from IPR2014-00839 (Technical Proposal to Con Edison, Inc. dated Jun. 28, 2001).
Exhibit 1038 from IPR2014-00839 (Stray Voltage Detection Program Final Report Review dated Jul. 2, 2002).
Exhibit 1041 from IPR2014-00839 (Memo from Doherty to Kressner, et al. dated Mar. 4, 2005).
Exhibit 1040 from IPR2014-00839 (Meeting between Con Edison and Sarnoff dated Jan. 30, 2004).
Exhibit 1062 from IPR2014-00839 (Declaration of Jeffrey L. Riback dated Jun. 1, 2015).
Decision—Institution of Inter Partes Review dated Nov. 26, 2014—from IPR2014-00839).
Power Survey, LLC's Updated Exhibit List dated Feb. 20, 2015—from IPR2014-00839.
Exhibit 1049 from IPR2014-00839 (Deposition of Robert Johnson dated Dec. 11, 2014).
Exhibit 1011 from IPR2014-00839 (Deposition of Dr. David W. Fugate dated Apr. 30, 2014).
Exhibit 1012 from IPR2014-00839 (Deposition of David Kalokitis dated Apr. 18, 2014).
Exhibit 1017 from IPR2014-00839 (Declaration of Robert Johnson dated May 30, 2014).
Exhibit 1021 from IPR2014-00839 (Declaration of Dr. Robert G. Olsen dated May 28, 2014).
Exhibit 2005 from IPR2014-00839 (Deposition of David Kalokitis dated Apr. 18, 2014).
Deposition of Robert G. Olsen dated Jan. 15, 2015—from IPR2014-00839.
Exhibit 2012 from IPR2014-00839 (Homyk Declaration dated Feb. 18, 2015).
Exhibit 2013 from IPR2014-00839 (Kressner Declaration dated Feb. 18, 2015).
Exhibit 2014 from IPR2014-00839 (Declaration of Andrew W. Carter dated Feb. 20, 2015).
Exhibit 2096 from IPR2014-00839 (Secondary System Analysis—2007 Stray Voltage Detection and Electric Facility Inspection Report).
Exhibit 2015 from IPR2014-00839 (Declaration of David W. Fugate dated Feb. 20, 2015).
Exhibit 2017 from IPR2014-00839 (Letter from Premier Utility Services LLC to Rhode Island Public Utilities Commission dated Sep. 12, 2012).
Exhibit 2041 from IPR2014-00839 (Secondary System Analysis—2005 Stray Voltage Detection and Electric Facility Inspection Report).
Exhibit 2053 from IPR2014-00839 (2007 Jodie Lane National Conference for Stray Voltage Detection, Migration, and Prevention).
Exhibit 2062 from IPR2014-00839 (Memorandum of Law in Support of Power Survey's Motion for Preliminary Injunction dated Mar. 31, 2014).
Exhibit 2079 from IPR2014-00839 (Distribution Engineering—Secondary System Analysis—2006 Stray Voltage Detection and Electric Facility Inspection Report).
Exhibit 2117 from IPR2014-00839 (National Grid letter to Rhode Island Public Utilities Commission dated Oct. 2, 2012).
Exhibit 2124 from IPR2014-00839 (Sarnoff News & Press Releases—Sarnoff Unveils Innovation Breakthrough in Stray Voltage Detection dated Nov. 15, 2005).
Exhibit 2135 from IPR2014-00839 (What has been done—Stray Voltage in New York City dated Feb. 3, 2014).
Exhibit 2140 from IPR2014-00839 (Central Hudson Gas & Electric Corporation—Contact (Stray) Voltage Testing and Facility Inspections—Report on the Results of the 2011 Contact (Stray) Voltage Testing and Facility Inspections dated Feb. 15, 2012).
Exhibit 2150 from IPR2014-00839 (Pepco letter to Public Service Commission of Maryland dated Aug. 2, 2012).
Exhibit 2156 from IPR2014-00839 (Declaration of David Kalokitis dated Mar. 31, 2014).
Exhibit 2157 from IPR2014-00839 (Declaration of Thomas Catanese dated Mar. 31, 2014 (Redacted Version)).
Exhibit 2177 from IPR2014-00839 (L3 Communications—Stray (Contact) Voltage Sensor Test Report dated Mar. 3, 2010).
Exhibit 2178 from IPR2014-00839 (Narda 8950/10—Stray Voltage Detection System—Operation and Installation Guide—Rev. 1—2010).
Exhibit 2180 from IPR2014-00839 (Premier Utility Services—Mobile Electric Field Sensor PEPCO Holdings Inc. dated Mar. 2, 2012).
Exhibit 2203 from IPR2014-00839 (Patent Owner's Objections to Petitioner's Evidence dated Dec. 11, 2014).
Exhibit 2204 from IPR2014-00839 (Deposition of Robert Johnson dated Jan. 29, 2015).
Exhibit 2205 from IPR2014-00839 (Deposition of Robert Eugene Johnson dated May 27, 2015—Redacted Version).
Exhibit 2206 from IPR2014-00839 (Supplemental Declaration of Andrew W. Carter dated Mar. 12, 2015).
Exhibit 2207 from IPR2014-00839 (Supplemental Declaration of David W. Fugate dated Mar. 12, 2015).
Final Written Decision dated Nov. 23, 2015 from IPR2014-00839 (*L-3 Communications Holdings, Inc. and Premier Utility Services, LLC v. Power Survey, LLC*).
Exhibit 1024 from IPR2014-00839 (Deposition of David W. Fugate dated Apr. 24, 2015).
Exhibit 1050 from IPR2014-00839 (Declaration of David Fugate in Rebuttal to Declaration of Robert G. Olsen dated Sep. 25, 2014).
Exhibit 1029 from IPR2014-00839 (Declaration of Arthur Kressner dated Apr. 22, 2015).
Power Survey's Notice of Cross-Examination Deposition of Petitioner's Declarant Dana Trexler Smith dated May 22, 2015—from IPR2014-00839.
Power Survey's Notice of Cross-Examination Deposition of Petitioners' Declarant Robert Johnson dated May 22, 2015—from IPR2014-00839.
Power Survey's Notice of Cross-Examination Deposition of Petitioners' Declarant Robert Johnson dated Jan. 20, 2015—from IPR2014-00839.
Patent Owner Response dated Feb. 20, 2015—from IPR2014-00839.
Patent Owner's Objections to Petitioner's Reply Evidence dated May 19, 2015—from IPR2014-00839.
Patent Owner Preliminary Response dated Sep. 11, 2014—from IPR2014-00839.
Petition for Inter Partes Review dated May 30, 2014—from IPR2014-00839.

(56) References Cited

OTHER PUBLICATIONS

Petitioners' Request for Oral Argument dated Jun. 2, 2015—from IPR2014-00839.
Memorandum of Law in Support of Power Survey's Claim Construction Motion dated Oct. 15, 2014—from IPR2014-00839.
Declaration of Dana Texler Smith dated May 12, 2015—from IPR2014-00839.

* cited by examiner

APPARATUS AND METHOD FOR MONITORING AND CONTROLLING DETECTION OF STRAY VOLTAGE ANOMALIES

CROSS-REFERENCE TO RELATED APPLICATIONS

This application is a continuation of pending U.S. patent application Ser. No. 14/828,062 filed on Aug. 17, 2015 which is a continuation of pending U.S. patent application Ser. No. 14/095,771 filed on Dec. 3, 2013, which is a continuation of pending U.S. patent application Ser. No. 12/321,484 filed on Jan. 21, 2009, which is a continuation-in-part of U.S. patent application Ser. No. 11/551,222, filed Oct. 19, 2006, now U.S. Pat. No. 7,486,081 which issued on Feb. 3, 2009, which claims benefit of U.S. Provisional Patent Application No. 60/728,168, filed Oct. 19, 2005, which is a continuation-in-part of U.S. patent application Ser. No. 11/224,909, filed Sep. 13, 2005, now U.S. Pat. No. 7,248,054 which issued on Jul. 24, 2007, which claims benefit of U.S. Provisional Patent Application No. 60/639,054, filed Dec. 23, 2004 and U.S. Provisional Patent Application No. 60/641,470, filed Jan. 5, 2005. Each of the aforementioned related patent applications is herein incorporated by reference.

BACKGROUND

Field

The present invention relates to the detection of electric fields, and more particularly, to apparatus and methods of detecting stray voltage anomalies in electric fields.

Description of the Related Art

Large power distribution systems, especially those in large metropolitan areas, are subject to many stresses, which may occasionally result in the generation of undesirable or dangerous anomalies. An infrequent, but recurrent problem in power distribution infrastructures is the presence of "stray voltages" in the system. These stray voltages may present themselves when objects, such as manhole covers, gratings, street light poles, phone booths and the like become electrically energized (e.g., at 120V AC). An electrically conductive path may be established between underground secondary network cabling and these objects through physical damage to electrical insulation resulting in direct contact between electrically conductive elements or through the introduction of water acting as a conductor. These energized objects present obvious dangers to people and animals in the general public.

Detecting the existence of stray voltages by means of assessing electromagnetic radiation is not practical because the wavelength of a 60 Hz electromagnetic wave is approximately 5,000 kilometers (i.e., about 3,107 miles) in length. To effectively radiate electromagnetic waves, a radiating object (e.g., manhole cover or light pole) should represent at least ¼ wavelength (i.e., about 776.75 miles) and a receiving "antenna" should be 1½ to 2 wavelengths away from the emitting source (about 6,214 miles). Two wavelengths is the distance required for electric and magnetic fields to come into time phase and space quadrature where they behave as a plane wave. A detection system will typically be perhaps 10 ft. to 30 ft. away from the energized object, so that detection will take place in the extreme near field where electric and magnetic fields exist in a complex temporal and spatial pattern, not as a unified electromagnetic plane wave. Thus, electric and magnetic fields must be considered and measured separately.

Due to power distribution networks typically having many miles of buried cable carrying perhaps thousands of amperes of current, the magnetic field in any one location due to such normal load is likely to be very high. Detecting magnetic fields arising from a relatively weak stray voltage anomaly would be very difficult due to the interference from strong ambient magnetic fields arising from normal loads and, therefore, it has been determined that the best way to detect a stray voltage anomaly is to assess the electric field.

Techniques for the detection of stray voltages are typically carried out by manual inspection of surrounding electrical infrastructures for signs of leaking current. An inspection team equipped, for example, with hand held detection devices may be employed to make direct physical inspections of electrical infrastructures. However, inspectors using these detection devices are typically required to make contact with portions of electrical infrastructures, such as streetlamp bases or manhole covers, in order to obtain accurate measurements for determining the existence of potentially dangerous stray voltages. These manual inspections are undoubtedly time-consuming and give a false sense of security.

Accordingly, there exists a need to provide a more efficient means for detecting and identifying sources of stray voltage anomalies over vast geographic areas, particularly, populated urban, suburban and rural areas.

SUMMARY

Apparatus and methods for detecting stray voltage anomalies in electric fields are provided herein. In some embodiments, an apparatus for detecting an electrical field may comprise: at least one sensor probe for generating data corresponding to an electrical field detected by the at least one sensor probe, wherein the at least one sensor probe comprises at least one electrode; a processor, coupled to the at least one sensor probe, for analyzing the data to identify a voltage anomaly in the electric field; and an indicator, coupled to the processor, for alerting a user to a presence of the voltage anomaly in the electric field.

In some embodiments, a method for detecting an electric field may comprise: sensing an electric field using at least one sensor probe, wherein the at least one sensor probe comprises at least one electrode; identifying a location of the sensor probe; collecting data representing the electrical field sensed by the at least one sensor probe; analyzing the collected data to identify a voltage anomaly in the electric field; and providing an indicator to alert a user to a presence of the voltage anomaly in the electrical field.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
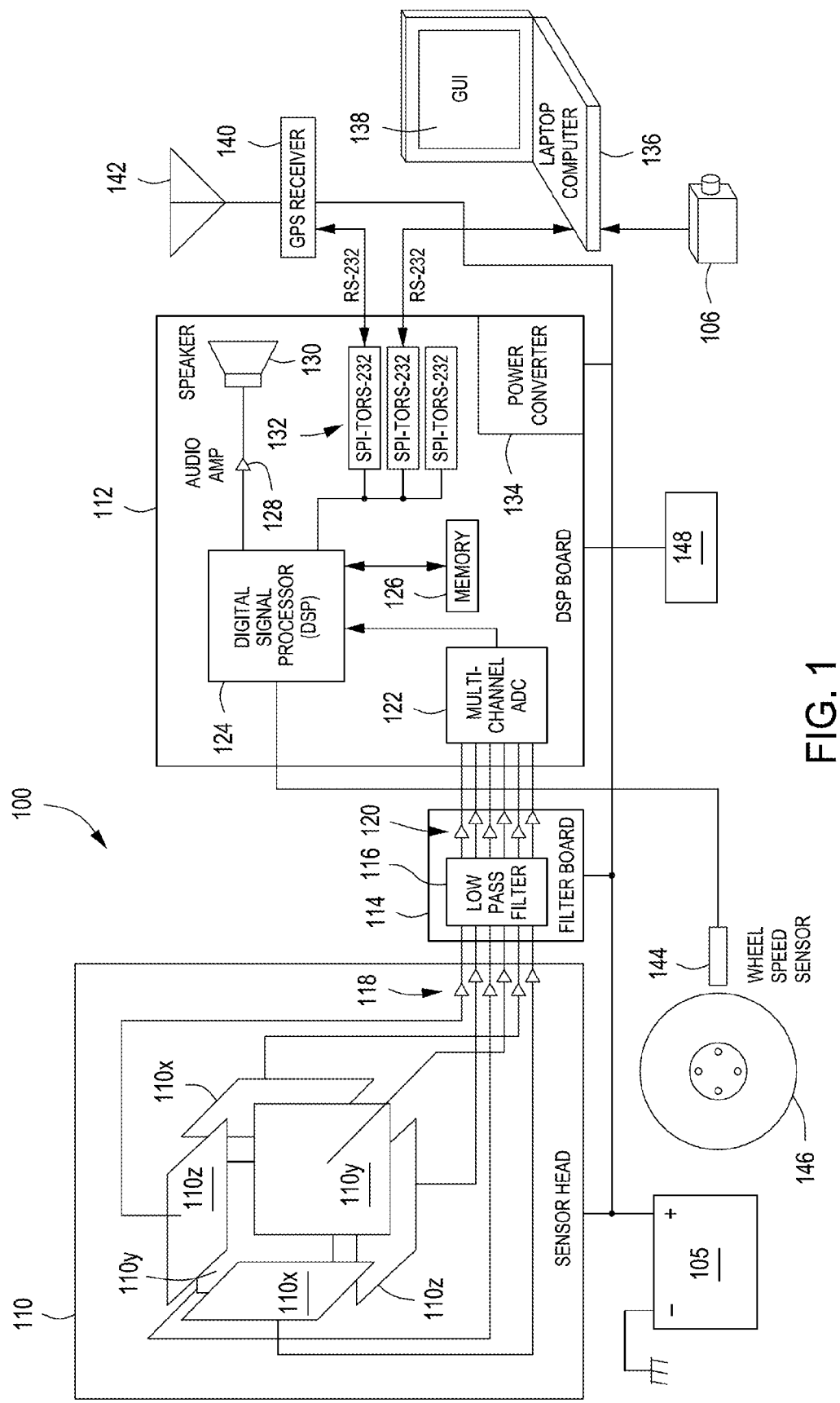
FIG. 1 is a schematic diagram of an exemplary sensor system in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention generally relate to apparatus and methods for detecting a stray voltage anomaly in an electric field. For purposes of clarity, and not by way of limitation, illustrative depictions of the present invention are described with references made to the above-identified drawing figures. Various modifications obvious to one skilled in the art are deemed to be within the spirit and scope of the present invention.

Figure 2:
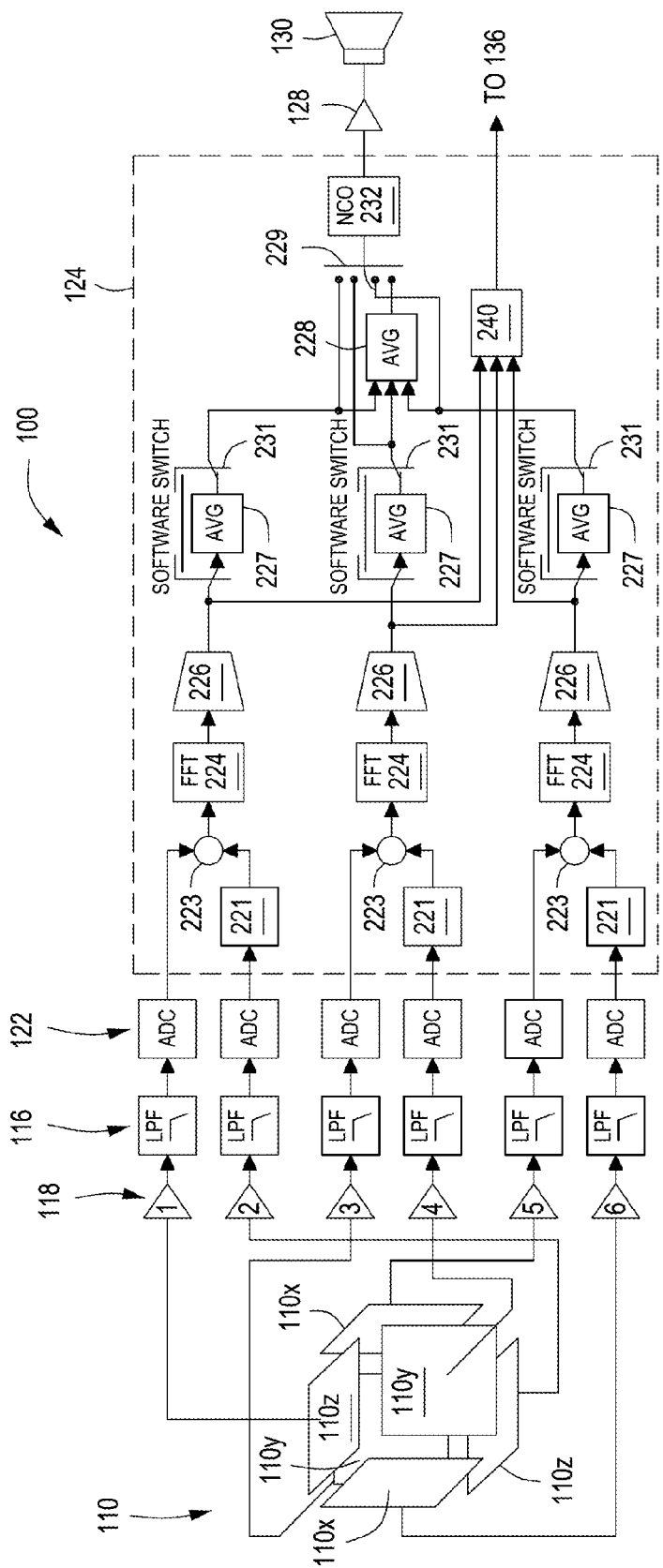
FIGS. 2-2A are schematic diagrams illustrating the operation of the sensor system employing digital electronic processing in accordance with some embodiments of the present invention.
Figure 2A:
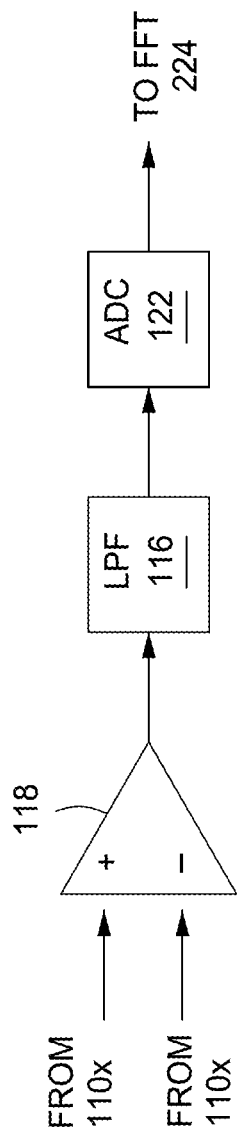

FIG. 1 is a schematic diagram of an exemplary sensor system in accordance with some embodiments of the present invention. FIGS. 2-2A are schematic diagrams illustrating the operation of the sensor system employing digital electronic processing in accordance with some embodiments of the present invention. To best understand the invention the reader should refer to FIGS. 1, 2 and 2A simultaneously.

In accordance with some embodiments of the present invention, sensor system 100 generally comprises a detection system unit (DSU) 110, which may receive electric field measurements from one or more sensor probes, wherein each sensor probe comprises of at least one electrode. For example, sensor probes 110$x$, 110$y$ or 110$z$ each may respectively comprise two electrodes 110$x$-110$x$, 110$y$-110$y$ and 110$z$-110$z$. The DSU 110 may employ any number of sensor probes for purposes of measuring an electric field in any particular area of interest being surveyed for stray voltage anomalies in electric fields, such as the embodiments discussed below with respect to FIGS. 3-5 and 7-8A. For example, the DSU 110 may employ only one of said sensor probes 110$x$, 110$y$ or 110$z$, additional sensor probes to supplement the measurements obtained by sensor probes 110$x$, 110$y$ or 110$z$ or, any other suitable combination of sensor probes. For example, in some embodiments, it may be such that the signals from one pair of electrodes do not ordinarily provide electric field data that is of interest, e.g., as where high-field producing overhead power distribution wires are present, and so the pair of electrodes, e.g., 110$z$-110$z$, that sense the vertical field components may be, but need not be, omitted. In some embodiments, the DSU 110 may employ a multi-axis sensor probe arrangement as the ones described, for example, in commonly owned U.S. Pat. No. 7,248,054, filed Sep. 13, 2005 and issued on Jul. 24, 2007, and U.S. Pat. No. 7,253,642, filed Sep. 13, 2005 and issued on Aug. 7, 2007, which are hereby incorporated by reference in their entirety.

The sensor system 100 employs a digital processing system (DPS) 112 capable of processing electrode data provided by the DSU 110 in near real time (e.g., with less than one second latency). It some embodiments, such as the embodiment depicted in FIG. 1, the DPS 112 is arranged to interface directly to a three-axis sensor probe arrangement, such as DSU 110.

In some embodiments, the DPS 112 comprises a multi-channel analog-to-digital converter (ADC) 122, a digital signal processor (DSP) 124, a memory (EEPROM) 126, an audio amplifier 128, audible transducing device (speaker) 130, one or more data converters 132 (e.g., uni-directional or bidirectional SPI to RS-232 converters), and a source of electrical power, such as a power converter 134. The power converter 134 provides the various voltages for operating the DPS 112 and other electronic devices. In some embodiments, electrical power for sensor system 100 may be obtained from any convenient electrical power source, such as the electrical system or battery 105 of the vehicle (e.g., truck) on or with which sensor system 100 is operated or a separate battery.

The DPS 112 is coupled to the DSU 110 via an input (analog) section 114, which comprises low pass filters 116 and buffer amplifiers 120. In some embodiments, for example such as the embodiment depicted in FIG. 1., the input section 114 comprises at least one (six shown) low pass filters 116, one for each electrode of sensor probes 110x, 110y, 110z, each preceded by an amplifier 118, and followed by a buffer amplifier 120. In some embodiments the amplifier 118 has a high input impedance and exhibits some gain.

In some embodiments, the low pass filter 116 cutoff frequency may be selected to minimize the effects of aliasing. For example, where the ADC 122 samples data provided from the sensor probes 110x, 110y, 110z at a rate of 960 samples per second, a suitable low pass filter 116 may have a cutoff frequency (at −3 dB) of about 240 Hz and a −24 dB per octave slope. Thus, at 900 Hz, the first frequency that directly aliases the 60 Hz frequency of interest, the low pass filter 116 supplies a rejection or attenuation of about 46 dB.

In some embodiments, a suitable ADC 122 may operate at a conversion burst rate of about 842 KSPS (kilo-samples per second). For example, every $1/960^{th}$ of a second the ADC 122 is commanded to perform 96 conversions, specifically 16 readings of each of six electrodes 110x-110x, 110y-110y, 110z-110z. The readings converted by ADC 122 may be alternated such that temporal distortion effects are minimized. For example, ADC 122 converts plate electrode 1 (+110z) data, then plate electrode 2 (−110z) data, and so on through plate electrode 6 (−110x). It then repeats this six-conversion sequence 16 times for a total of 96 conversions. This burst of conversions takes approximately 114 microseconds (96/842 KHz), which is approximately 11% of the $1/960^{th}$ of second allotted for conversion, while reducing quantization errors by a factor of four. Other ADC arrangements and/or other ADC control arrangements may be employed.

The data may be transferred into memory 126 from the ADC 122 via a serial link driven by a Direct Memory Access (DMA) function within the DSP 124. In some embodiments, such as in FIG. 2, differential data may be obtained from single ended data provided to the DSP 124 by the negation 221 of one of the pair of single ended data values and the summing 223 of one single ended data value with the negated data value. In such embodiments, the single-ended signals from electrodes 110x-110x, 110y-110y, 110z-110z may be coupled to the differential-to-single-end amplifiers 118 that provide balanced inputs with gain and convert the signal to single ended analog format to simplify subsequent processing, e.g., by lowpass filters 116. A multi-stage active low pass filter 116 then processes the signal to reduce signals other than the desired 60 Hz signal, i.e. to help separate the desired signal from near frequency interfering E-field signals. The signal is then further amplified and buffered and routed to ADC 122.

Upon completion of each 96 event burst conversion, as described above in reference to the operation of ADC 122, the DSP 124 averages the data to obtain six values (one for each of the six electrodes 110x-110x, 110y-110y, 110z-110z), and stores the six values, e.g., in a single row of a 6×256 point matrix of a memory internal to DSP 124. This action is repeated 256 times until the entire matrix of the internal memory of DSP 124 is filled, at which point DSP 124 performs six Fast Fourier Transforms (FFTs) 224 on the six column vectors. Each FFT 224 yields a frequency domain representation of the prior 256 samples (for each electrode 110x-110x, 110y-110y, 110z-110z) in the form of 128 complex values. Each of these complex values represents the phase and amplitude of the opposing electrode 110x-110x, 110y-110y, 110z-110z signal within a bin 226 of 960 Hz/256=3.75 Hz. The $16^{th}$ FFT bin 226 contains the 60 Hz information, which is the only information that is of interest with respect to sensing stray 60 Hz voltages. Processor DSP 124 calculates the magnitude squared of this bin 226 data (its real part squared summed with its complex part squared), and assigns this value as the field strength for the electrode 110x-110x, 110y-110y, 110z-110z that produced it. This process yields six field strength values at a rate of 960 Hz/256=3.75 Hz.

In some embodiments, such as depicted in FIG. 2A, differences between time domain values for the electrodes 110x-110x, 110y-110y, 110z-110z are calculated, resulting in a 3×256 point matrix, which is then processed using the FFT 224 as described in the previous paragraph.

In some embodiments, measured field data from the sensor probes 110x, 110y, 110z is stored as measured ("raw" data), e.g., as six sets of data as produced by the electrodes 110x-110x, 110y-110y, 110z-110z or as three sets of differential data as produced the three pair of probe electrodes 110x-110x, 110y-110y, 110z-110z, or both. Data may be stored in a memory 126 of the DSP 124, or provided to a computer 136 or to any other device for storage and/or further analysis at the user's desire.

The computer 136 may provide a graphical user interface (GUI) 138 for an operator to control the operation of the sensor probes 110x, 110y, 110z, and sensor system 100, in particular, the DSP 124, and to monitor field data as measured. For example, an operator may adjust the values of the constants and scaling factors utilized in the detection and averaging processing for producing an audible alarm as described. An example of a command set for computer 138 is set forth below. The commands may be executed by single keystroke entries, plural keystroke entries, or mouse clicks. The data may be stored in any format that would allow the stored data to be exported to a readable format, such as a database, spreadsheet, text document, or the like.

Sensor System Command Set Listing

A brief description of example sensor system commands that are available to a user of the sensor system in accordance with some embodiments of the present invention follows. Commands may be executed in response to the symbol (given at the left margin below) being entered via the keyboard of computer or by a point-and-click entry. Note: Unrecognized characters generate a question mark "?" and an echo of that character to indicate that an invalid command has been entered.

H Display Help Screen—Causes the Help screen that lists all commands to be displayed.

{ Enter GPS Console Mode—GUI directly communicates with GPS and all keyboard entries are forwarded to GPS, i.e. not interpreted as SVD commands)

} Exit GPS Console Mode

Z Display Zulu time to the console

V Display current software Version number

L Display the current GPS Latitude, Longitude, Elevation and Zulu time

> Enter Stray Voltage Detect Data Spew Mode—Data for all six probe plates is displayed at the 3.75 Hz rate at which it is produced < Exit Stray Voltage Detect Data Spew Mode + Increase SVD audio alarm manual threshold by 1 dB (only in "P" or "D" beeper modes)

− Decrease SVD audio alarm manual threshold by 1 dB (only in "P" or "D" beeper modes)

P Differential Probe Mode OFF—Beep (audio tone) if signal from any probe plate exceeds the SVD threshold. (500 Hz tone @ 50% duty cycle at 3.75 Hz rate)

D Differential Probe Mode ON—Audio tone pitch is based on average of signals of all three differential plate pairs if in "S" or "U" modes (otherwise 500 Hz tone @ 50% duty cycle at 3.75 Hz rate if any differential pair of probes exceeds SVD threshold)

X Disable (or mute) the beeper (audio tone) until "P" or "D" or "S" command

S Audio tone pitch set proportional to 60 Hz field strength *squared*

U Audio tone pitch is un-weighted average of last 32 magnitude squared values.

I Toggle display to the next of speed (in mph), distance (in wheel speed pulses) and OFF F Display current vehicle speed (in mph).

A Put DSP in Automatic (data streaming) mode to display Log file as it is generated M Put DSP in Manual mode (for terminal control), exiting the "A" mode

Spew data display for the three differential probe pairs at a 60 lines/sec rate.

T Increase the "singer" (audio tone) cutoff threshold by ~0.5 dB and display new value t Decrease the "singer" (audio tone) cutoff threshold by ~0.5 dB and display new value G Increase "singer" (audio tone) pitch gain by ~0.5 dB and display new value g Decrease "singer" (audio tone) pitch gain by ~1 dB and display new value

* Restore default settings.

0 Operate in Differential Mode with tone based on average of all six plates (same as D above)

1 Operate in Differential Mode with tone based on plates 1-2 (top and bottom plates)

2 Operate in Differential Mode with tone based on plates 3-4 (left and right plates)

3 Operate in Differential Mode with tone based on plates 5-6 (fore and aft plates)

4 Connect X auxiliary electrodes together (toggle connect/disconnect)

5 Connect Y auxiliary electrodes together (toggle connect/disconnect)

6 Connect Z auxiliary electrodes together (toggle connect/disconnect)

$ Connect X auxiliary electrodes to common (toggle connect/disconnect)

% Connect Y auxiliary electrodes to common (toggle connect/disconnect)

^ Connect Z auxiliary electrodes to common (toggle connect/disconnect)

To this end, DSP 124 may further comprise a data streamer 240 which provides the unaveraged data independent of the settings of software switches 229, 231. Data provided by data streamer 240, e.g., in a SPI format, may be converted into another standard digital data format, e.g., into RS-232 format, by data converters 132. Data converters 132 may also convert data received in a given format, e.g., RS-232 format, into a format compatible with DSP 124, e.g., SPI format, as is the case for data provided by global positioning system (GPS) receiver 140. GPS receiver 140 may be any locating device capable of receiving signals from an antenna 142 broadcast by one or more GPS satellites orbiting the Earth to determine therefrom its location on the Earth.

Once the six field strength values (or three differential field strength values) are determined, higher-level procedures employ these six values (or three values) to produce data in a form that is meaningful to the user. For example, a simplistic detection alarm is available to the user that compares the six field strength values (or three differential field strength values) to a user-defined threshold, and activates a simple audible alarm provided by a audio amp 128 and a speaker 130, for example, a pulsing audio alarm, if any of these six values exceeds the threshold.

In some embodiments, the detection alarm may produce a continuous output whose pitch is proportional to the field strength. To accomplish the continuous aspect of this audible output, the field strength values may be calculated at a rate far greater than the basic 3.75 Hz of the FFT data. To this end, the processing algorithm performs the 256-point FFT 224 on the most recent 256 samples collected (for each electrode 110$x$-110$x$, 110$y$-110$y$, 110$z$-110$z$) as before, but to perform this operation at a 60 Hz rate. Thus after every 16 additional averaged sample set values are collected, the FFT 224 is re-performed, producing the six field strength values (one for each electrode 110$x$-110$x$, 110$y$-110$y$, 110$z$-110$z$) at a rate of 960 Hz/16=60 Hz. The large degree of time domain overlap from each FFT 224 to the next FFT 224 while using this process produces a far smoother output stream than is produced at the basic 3.75 Hz rate.

The field strength values produced by the FFT 224 process range from about zero to about two million. Reasonable example frequencies audible to humans for this type of detection system would fall into a range between approximately 70 Hz and approximately 3 KHz. The 16-bit timer-counter in the DSP 124 may further comprise a 4-bit prescaler that allows its incident clock to be pre-divided (prescaled) by a programmable value between about 1 to about 16. With a prescale factor of 16, an additional divide-by-two frequency reduction occurs due to the toggling nature of the counter-timer output as described above, and at a maximum period value of $2^{16}$=65536, an audio tone of 144 MHz/(16*2*65536)=68.66 Hz results. Because little useful data is contained in field strength values less than about 10, these field strength values are programmed to produce no audible output. For a field strength of 10, a 69.3 Hz tone results, brought about by 64939 being written into the timer-counter period register.

To compensate for the inability of typical human hearing to accurately discern pitch differences of an eighth of a step (a half-step is defined as a $2^{(1/12)}$ change in pitch, equivalent the difference between adjacent notes in the equal tempered chromatic scale commonly used in western music), the pitch table used is based upon this amount of pitch change, so that discrete pitch changes would be perceived as a continuum by a human listener. Thus, an incremental pitch change in the audio output of the sensor system 100 results in a frequency change of $+/-(1-2^{(1/96)})$, or +/−0.7246%. The effect of an apparently continuous pitch output is thus achieved from a discrete pitch system. The 512-step pitch table employed covers a pitch range from 69.3 Hz to $2^{(512/96)}*69.3$=2.794 KHz.

In some embodiments, the field strength data from the DSP 124 may range from about 10 to about 2,100,000, or approximately 5.3 decades. This data is likewise parsed logarithmically to fit the 512 element pitch table, such that any increase of $10^\wedge(1/96)$ would produce an increase of one increment in pitch. So for every 10 dB that the field strength increases, the pitch of the audio output 275 increases by about one octave. The period value written into the timer counter is thus $144 \times 10^\wedge 6$ divided by 32 (or 4.5 million) divided by the desired output frequency. The 512-element pitch table is thus made up of two columns, one representing field strength, and one representing timer-counter period. The process to determine the output audio pitch finds the field strength table value nearest to, but not greater than, the current actual field strength value, and applies the accompanying period value to a numerically controlled oscillator (NCO) 232.

In some embodiments, such as the embodiment described above, NCO 232 comprises both a period register and a timer register. When the timer register counts down to zero, it reloads from the period register and then counts down from the period value. The process described may only update the period register, thus avoiding the generation of transient pitch discontinuities that would sound to the ear as a "pop" or "crack." The count register may be updated during high-to-low or low-to-high transitions of the audio output, thereby producing a continuous quasi-portamento output tone.

In some embodiments, for example when an audio tone is the principal output to the user, further smoothing of the data may provide what could be considered a more pleasing audible output. Pitch discontinuities caused by vibration of the electrodes 110*x*-110*x*, 110*y*-110*y*, 110*z*-110*z* and other transient effects may make the audio output significantly less meaningful to the user. An unweighted 32-point averaging filter 227 directly preceding the NCO 232 in the audio processing chain, although it introduced an additional latency of 32/60 Hz=0.533 seconds to the system 100, may significantly mitigate these transient effects, thus increasing user effectiveness at interpreting the audio data. The total system latency, with this additional averaging filter 227 enabled (it can be enabled or disabled by the user via software switch 231), is thus 32/60 Hz+256/960 Hz=0.8 seconds. This is specifically the latency between the detection of a field by the sensor probe 110*x*, 110*y*, 110*z* and its resultant tone production by the audio system (e.g., audio amplifier 128 and speaker 130).

In some embodiments, the software of DSP 124 may be structured to support differential data when using the 60 Hz output data rate mode. Differential probe electrode data may be used to provide a higher signal-to-noise ratio compared to that of any single plate electrode. The user may be given the capability to select, e.g., setting software switches 229, 231, via the graphical user interface (GUI) 138 of computer 136, which of electrodes 110*x*-110*x*, 110*y*-110*y*, 110*z*-110*z* to use to drive the system audio amplifier 128 and speaker 130, plus a fourth option, the average 228 of all three pairs. The 60 Hz output data then controls a numerically controlled oscillator (NCO) 232 within DSP 124 for producing an audio pitch (tone) that is proportional to field strength. Because the perception of pitch in humans is logarithmic, the raw field strength data is converted to a logarithmic scale by DSP 124, which may be accomplished in any convenient manner, e.g., by means of a look-up table.

In some embodiments, for certain DSP 124 devices, e.g., a type TMS320VC5509 digital signal processor available from Texas Instruments located in Dallas, Tex., the NCO 232 producing the audio output (nominally a square wave) is the output of a timer-counter integral to the DSP 124 integrated circuit (IC). The DSP 124 sets the frequency of this timer-counter by writing to it a period value. The nominal DSP 124 clock (144 MHz, in one example) causes the timer-counter to count down from this period value to zero, at which point an output signal toggles state from high to low (or from low to high).

In some embodiments, a Global Positioning System (GPS) receiver 140 provides a location reference including latitude, longitude, elevation, time and date so that the location of the sensor system 100 is known to a reasonably high precision. GPS position data may be exported to a conventional GPS mapping software for utilization. The GPS location information may be stored, e.g., in the memory of DSP 124 or of computer 136, so that there is a stored precision location and time reference associated with the stored measurements of 60 Hz field data from the DSU 110.

Thus, the GPS location data provides a record of the location at which each detected stray voltage field was detected and the time thereof, as may be desired for subsequent analysis, e.g., for reviewing the location of a stray voltage anomaly and identifying the source thereof. Because the peak of the response to a source of stray voltage anomaly cannot be ascertained until after the vehicle has passed the source, the exact location of the source may not be observed until after the time at which it is detected, i.e. until after it is passed. While having this stray voltage and location data recorded is desirable and beneficial, in a typical service environment, e.g., on a city street, it is not practical to stop the vehicle carrying system each time a stray voltage is detected, or to back the vehicle up to ascertain the exact location at which the detection took place.

Because the sensor system 100 may be operated in urban/city environments where buildings and other obstacles distort and/or block signals from a GPS satellite system from reaching the GPS antenna 142 via a direct path, GPS location information may have degraded accuracy, or may not be available. Other means of determining the location of the sensor system 100, such as a wheel speed sensor 144, may be utilized in place of, or in conjunction with, the GPS location information. Typically, wheel speed sensor 144 may detect revolutions of wheel 146 and, because the circumference of wheel 146 is known, distance and speed can be determined from the revolution of wheel 146.

For example, the wheel speed sensor 144 may produce four signals, typically pulses, for each revolution of wheel W, wherein each signal represents about 16 inches (about 40-41 cm) of linear travel. Most manhole covers MHC are about 30-40 inches (about 0.75-1.0 m) in diameter, and so wheel speed indications every one to two feet (about 0.3 to 0.6 m) is sufficient to locate a manhole MHC cover having stray voltage thereon. One suitable embodiment of wheel speed sensor 144 utilizes a Hall-effect sensor mounted so that the wheel lugs (studs and nuts) that secure wheel W to an axle pass close enough that the Hall-effect sensor produces a detectable output pulse therefrom.

This may advantageously eliminate the need for a transmitted or other 60 Hz timing reference and, therefore, it may be disposed on and operated from a vehicle moving at a substantial speed, e.g., up to 15-25 miles per hour (about 24-40 km/hr), or faster. In addition, this allows processing of the sensed stray voltage data in essentially "real time" so as to facilitate an operator understanding and responding to the sensed data. For example, in some embodiments the sensor system 100 may detect an energized manhole cover at a distance of about 15 feet (about 4.5 meters) when moving at speeds of up to about 10 mph (about 16 km/hr) or less, and consistently detect an energized light pole at a distance of about 25 feet (about 7.5 meters) when moving at speeds of up to about 20 mph (about 32 km/hr) or less.

In some embodiments, the sensor system 100 may additionally comprise an imaging system unit (ISU) 106, which may receive video input from one or more cameras. The ISU 106 may employ any number of cameras suitable for providing streaming images of a patrolled scene. Cameras employed may be video cameras, stereo cameras, various digital cameras, a combination of the aforementioned cameras or any other suitable camera and arrangement of cameras suitable for imagining a patrolled scene.

In some embodiments, one or more of cameras may be provided for imaging the environs where sensor system 100 is employed. For example, where sensor system 100 is deployed on a patrol vehicle or trailer, two cameras may be provided thereon, wherein each camera is directed to view in a direction about 90° to the left of the direction of travel and 90° to the right of the direction of travel, so that images of what is present to the left and to the right of the patrolling vehicle are obtained. Video images therefrom may be recorded sensor system 100 traverses a patrolled environment.

Video images may be obtained at a standard video rate, e.g., at 30 or 60 frames per second, but may be at much slower rates, e.g., one or two frames per second, consistent with the speeds at which the patrolling vehicle moves. For example, if a vehicle is moving at between 10 and 20 mph (about 14-28 feet per second or about 4.2-8.5 m/sec.), video at a two frames per second video rate would provide a new image for approximately each 14 feet (about 4.2 m) or less of travel, which should be sufficient to identify the location at which the stray voltage was detected.

The video images may all be recorded (stored) or only selected images may be recorded. In some embodiments, video images are stored in a video frame data buffer having a capacity to store a number of frames of video data for a set period of time. As each new frame is stored, the oldest previous frame is lost. Thus, the video data buffer contains video frames for the most recent period of time. In some embodiments, a "frame grabber" card, in the form of a PCMCIA card or an internal card, may be employed to synchronize electric field data sensed by DSU 110 with processed video data from ISU 106.

Upon detection of a stray voltage, the operator can cause the video images to be stored in a more permanent memory, or in another buffer, e.g., by activating a "Capture" function of computer 136, whereby the video of the scenes to the left and to the right of the vehicle over a thirty second period including the time at which the stray voltage was detected are stored and may be reviewed at the operator's convenience, e.g., either at that time or at a later time. Such storing action may be provided by inhibiting the video buffer from accepting additional frames of video data, thereby freezing the data then stored therein, or may be by transferring the data then stored in the video buffer to another memory device, such as the hard drive of computer 136 and/or a removable memory, e.g., a floppy disk, a CD ROM disk, a thumb drive, a memory card, a memory stick, or the like.

In some embodiments, in addition to storing the video images, the audio tones produced by the sensor system 100 (and/or data representing the tones), the GPS location data, the wheel speed sensor 144 data, or a combination thereof, are stored so that the video images may be reviewed in synchronism with the detection tone (and/or data representing the tone) and the GPS location to allow a user/operator to more accurately locate where the stray voltage was detected. For example, upon play back of the video data, the GPS location information may be displayed and/or the audio tone may be reproduced, so that the operator can accurately locate the source of the stray voltage. Control thereof may by icons and other controls provided by a graphical user interface (GUI) 138 of computer 136, such as described below with respect to FIGS. 10-21. Playback of the synchronized stored data may also be utilized for training personnel in operation of sensor system 100.

In some embodiments, the sensor system 100 may further comprise a transceiver component 148 configured to transmit and receive data transmissions to and from remote transceivers. For example, transceiver component 148 may be a transceiver of the type that is compatible with Wi-Fi standard IEEE 802.11, BLUETOOTH™ enabled, a combination of local area network (LAN), wide area network (WAN), wireless area network (WLAN), personal area network (PAN) standards or any other suitable combination of communication means to permit transmission of data. For example, transceiver component 148 may be a BLUETOOTH™ enabled device, thereby providing a means for communicating stray voltage related information between sensor system 100 and a remote device, such as a personal digital assistants (PDAs), cellular phones, notebook and desktop computers, printers, digital cameras or any other suitable electronic device, via a secured short-range radio frequency. Thereafter, a utility member equipped with the remote device configured to receive the stray voltage related communication may be dispatched to a site determined to have a potential stray voltage anomaly for purposes of neutralizing the anomaly. It should be noted that the aforementioned are provided merely as exemplary means for wireless transmission of stray voltage related data. Other suitable wireless transmission and receiving means may be employed in the present invention.

The computer 136 or other suitable computing system may provide a GUI 138 for an operator to control the operation of sensor system 100, particularly measurement and processing components associated with DSU 110, and to monitor electric field data as measured. For example, an operator may adjust the values of the constants and scaling factors utilized in the detection and averaging processing for producing an audible alarm (described in detail below). The computer 136 may also provide a convenient means for storing a record or log of the measured field and location (GPS) data for subsequent review and/or analysis, as might be desired for determining when and where a stray voltage anomaly existed.

GUI 138 receives data, directly or indirectly, from various components described in conjunction with sensor system 100 and, accordingly, displays them to the operator for purposes of controlling and monitoring the detection of stray voltage anomalies present in patrolled areas. GUI 138 may be a video based interface having a video display. The data provided to GUI 138 provides the interface operator with an opportunity to visually monitor and analyze incoming data measured by a stray voltage detection system on the video display.

Figure 3:
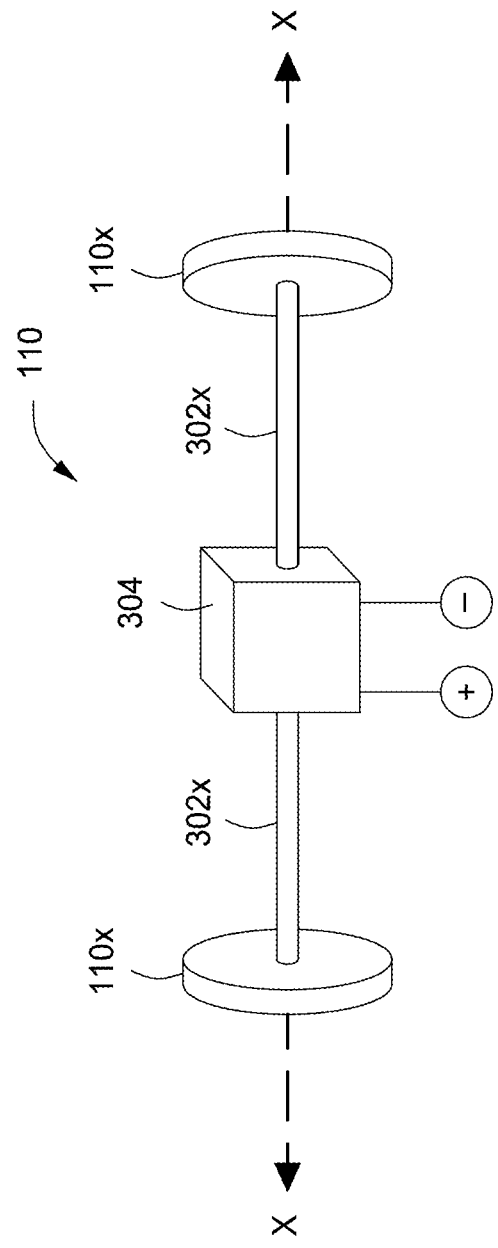
FIGS. 3-5 are illustrations of a detection system unit (DSU) in accordance with some embodiments of the present invention.

FIG. 3 is a schematic diagram of a DSU 110 in accordance with some embodiments of the present invention. In some embodiments, such as where the DSU 110 does not have access to a ground reference, the DSU 110 may use a differential sensor. DSU 110 may comprise two spaced-apart metalized plate electrodes 110$x$-110$x$ (electrode pair 110$x$), separated by an insulating structure 302$x$. The insulating structure 302x may be rigid so that vibration or other physical motion of the DSU 110 while in the presence of static and low frequency fields does not cause spurious output in the 60 Hz frequency region. The electrodes 110x-110x may be connected to an amplifier 304. In some embodiments, the amplifier 304 is a high input impedance amplifier (e.g., about 60 Tera-ohms). Sensitivity of the DSU 110 is a function of the size and separation of the plate electrodes.

The efficiency and sensitivity of the DSU 110 may be negatively affected by interference from other electric fields. Interfering electric fields may be produced by other electrified devices, such as storefront signs, electronic devices, or the like. In addition, as people move about, e.g., as pedestrians, they tend to generate electric charges on their clothing. These interfering background electric fields caused by the electric charges associated with people typically occur in the DC to 20 Hz frequency range. The aforementioned potentially interfering electric fields may produce charges that can induce a voltage on the electrodes 110x-110x of the DSU 110, thus reducing the sensitivity of the DSU 110. This problem may be mitigated by employing feedback in the amplifier 304 (i.e., the differential pre-amplifier discussed above) that reduces its sensitivity to low frequency fields without reducing the very high input impedance at 60 Hz that helps give the sensor system 100 its high sensitivity to 60 Hz fields.

Figure 4:
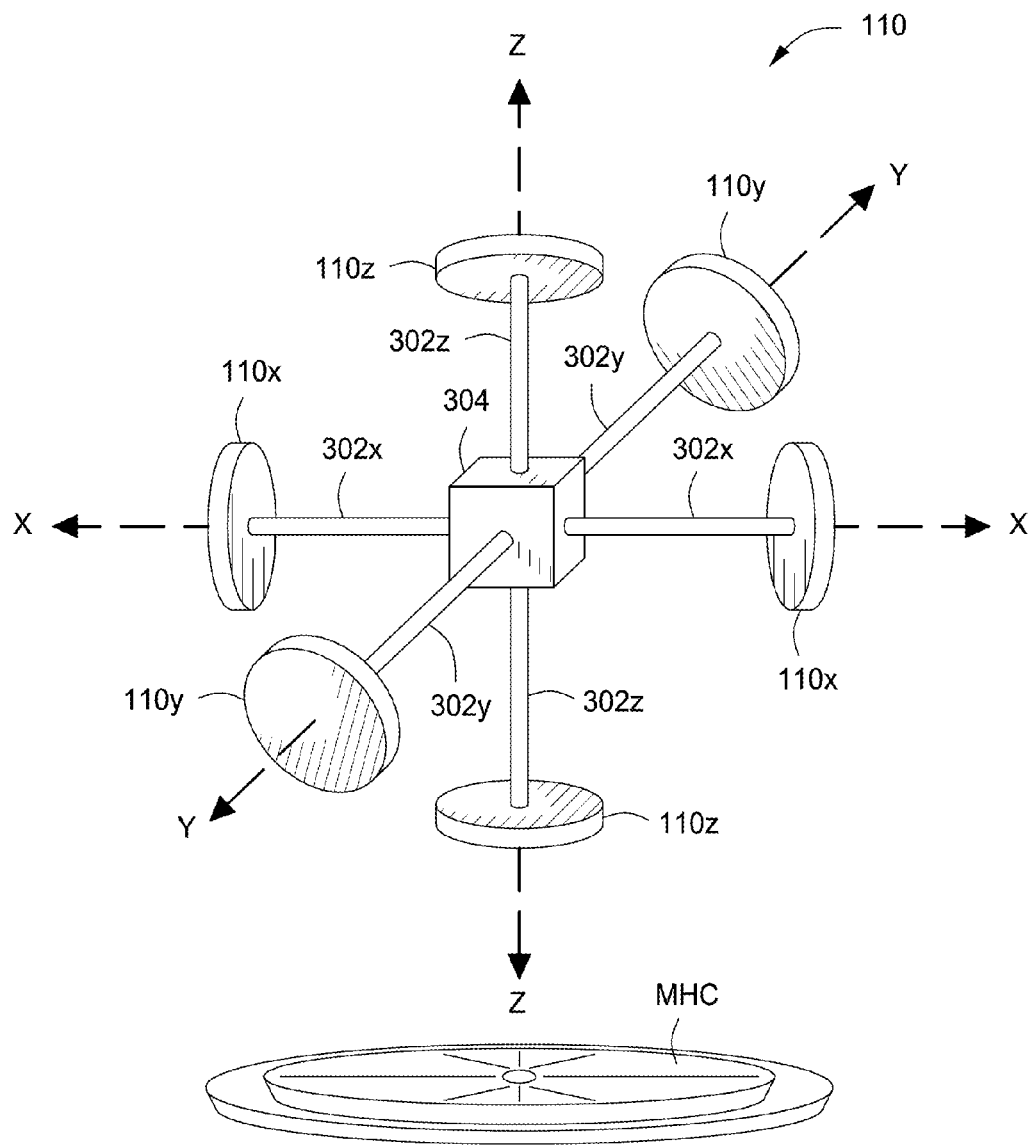

FIG. 4 is a schematic diagram of a three-axis (tri-axial) DSU 110 in accordance with some embodiments of the present invention. A three axis arrangement may be employed to make X, Y and Z-axis electric field measurements simultaneously. The DSU 110, depicted schematically in relation to a manhole cover MHC, comprises three pairs of spaced apart electrodes 110x-110x, 110y-110y, 110z-110z (electrode pairs 110x, 110y, 110z), of the sort shown in FIG. 2 arranged in three mutually orthogonal directions and each supported by an insulating structure 302x, 302y, 302z. A high input impedance amplifier 304 may be associated with each pair of electrodes, and may be embodied in any arrangement of differential circuitry, of single ended circuitry, or a combination thereof, as may be convenient.

Figure 5:
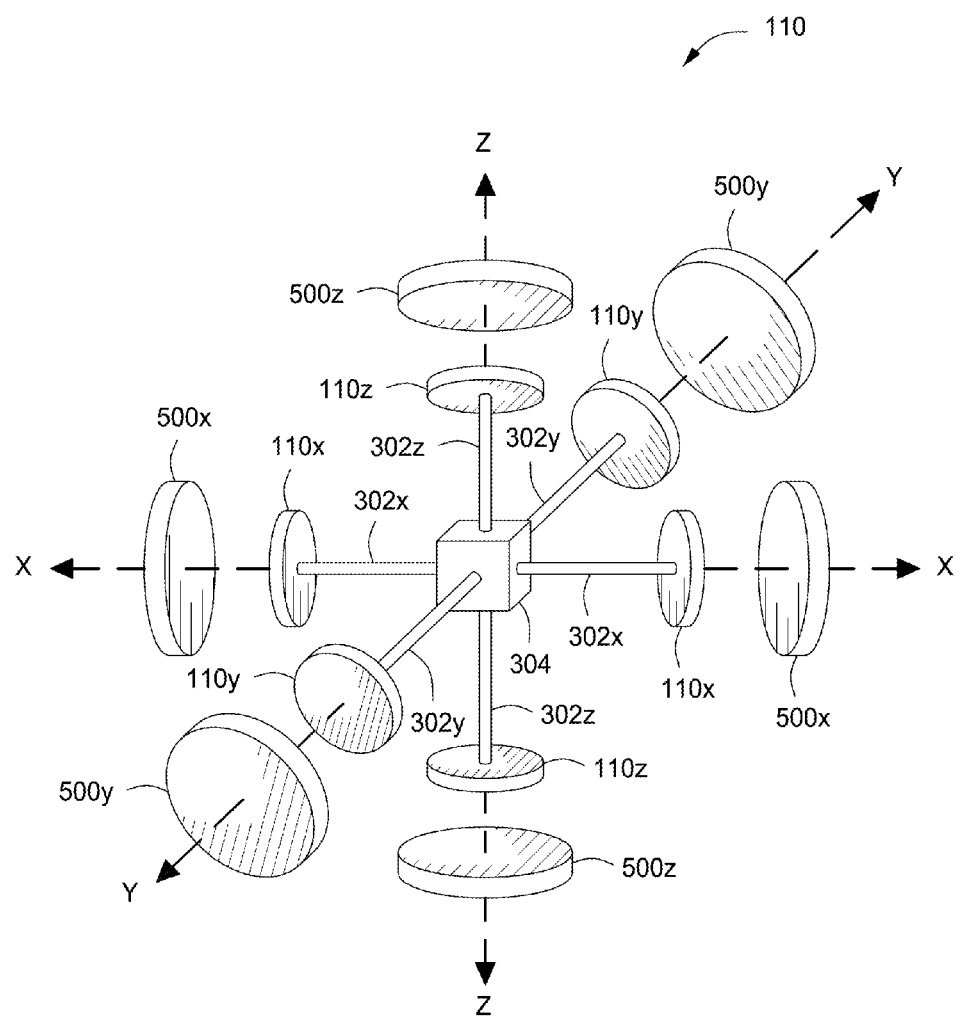

FIG. 5 is a schematic diagram of DSU 110 in accordance with some embodiments of the present invention. In some embodiments, DSU 110 may further comprise at least one pair (three shown) of electrically conductive auxiliary electrodes 500x-500x, 500y-500y, 500z-500z (auxiliary electrode pairs 500x, 500y, 500z) in addition to the electrode pairs 110x, 110y, 110z. The auxiliary electrode pairs 500x, 500y, 500z may be supported in a similar manner as the electrode pairs 110x, 110y, 110z as described above. In some embodiments, auxiliary electrodes 500x-500x, 500y-500y, 500z-500z may be planar and disposed generally parallel to each other and outboard of electrode pairs 110x, 110y, 110z (further from the center of DSU 110) along their respective axis.

The auxiliary electrodes 500x-500x, 500y-500y, 500z-500z may be any shape or size suitable to allow for accurate measurements. In some embodiments, the auxiliary electrodes 500x-500x, 500y-500y, 500z-500z may be smaller, the same size, or larger than the electrodes 110x-110x, 110y-110y, 110z-110z. In some embodiments, the auxiliary electrodes 500x-500x, 500y-500y, 500z-500z are about two times the size of electrodes 110x-110x, 110y-110y, 110z-110z, and may be disposed to define a cube that is about two times as large as that of a cube defined by the electrode pairs 110x, 110y, 110z. In some embodiments, auxiliary electrodes 500x-500x, 500y-500y, 500z-500z may be positioned generally parallel to electrodes 110x-110x, 110y-110y, 110z-110z, respectively.

In some embodiments, for example where electrode pairs 500x, 500y, 500z, are utilized, the electrode pairs 500x, 500y, 500z are electrically floating, i.e. they are not electrically connected to any of electrode pairs 110x, 110y, 110z, or to DSU 110 or sensor system 100. When not electrically connected, auxiliary electrode pairs 500x, 500y, 500z, may alter the electric field, but do not unacceptably affect the sensing thereof by electrode pairs 110x, 110y, 110z.

In some embodiments, when it is desired to confine or to direct the sensitivity of the electrode pairs 110x, 110y, 110z, in a particular direction, then one or more of auxiliary electrodes 500x-500x, 500y-500y, 500z-500z, are connected to one or more other auxiliary electrodes 500x-500x, 500y-500y, 500z-500z. One such connection is to make an electrical connection between the auxiliary electrode pairs 500x, 500y, 500z that are on the same axis.

In some embodiments, for example, when a high voltage source is overhead, as where high tension electrical power distribution lines are overhead, the auxiliary electrodes 500z-500z, which are spaced apart along the Z (or vertical) axis, may be connected together while making lateral (i.e. fore-aft and left-right) field measurements. As a result of this connection of auxiliary electrodes 500z-500z, vertically oriented fields, or at least primarily vertically oriented fields, from overhead sources are kept from leaking into or causing signal output on the X and Y axis electrode pairs 110x, 110y, or at least the effect of such vertically oriented fields on the X and Y axis electrode pairs 110x, 110y is substantially reduced. In addition, the pair of auxiliary electrodes 500z may be connected to a reference point, or to a ground, if available. Alternatively, any auxiliary electrode pair 500x, 500y, 500z, may be connected together to similarly alter directional sensitivity.

In some embodiments, for example, when a high voltage source is alongside, as where high tension electrical power distribution equipment is nearby and close to ground level, the two pair of auxiliary electrodes 500x and 500y, which are spaced apart along the X and Y (or lateral) axes, may be respectively connected together while making vertical (i.e. Z axis) field measurements. As a result of these connections of auxiliary electrode pairs 500x, 500y, laterally oriented fields, or at least primarily laterally oriented fields, from ground-level sources are kept from leaking into or causing signal output on the Z axis sensor electrode pair 110z, or at least the effect of such laterally oriented fields on the Z axis sensor electrode pair 110z is substantially reduced. In addition, and optionally, the pairs of auxiliary electrodes 500x, 500y may be connected to a reference point, or to a ground, if available. Alternatively, any two pair of auxiliary electrodes 500x, 500y, 500z, may be connected together to similarly increasing directional sensitivity.

Figure 6:
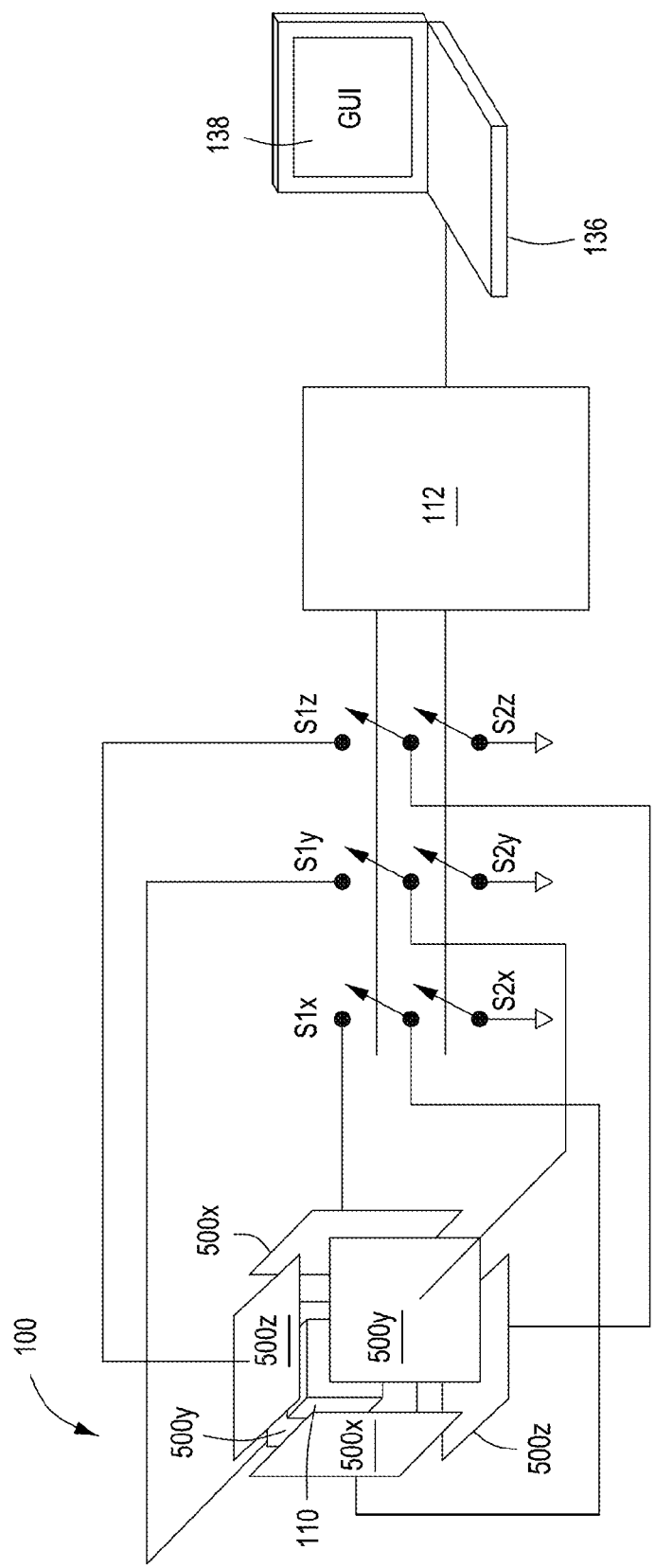
FIG. 6 is a schematic diagram of an exemplary sensor system utilizing the DSU illustrated in FIG. 5.

In some embodiments, for example as depicted in FIG. 6, auxiliary electrodes 500x-500x, 500y-500y, 500z-500z, may be selectively connectable to each other by switches S1x, S1y, S1z, respectively. The switches S1x, S1y, and S1z are sufficient to provide the desired respective selectable switching function for auxiliary electrode pairs 500x, 500y, 500z so as to enable the selective directing of the sensitivity of the electrode pairs 500x, 500y, 500z, respectively. Control of switches S1x, S1y, S1z may be effected using computer 136 via DPS 112, by activating respective toggle-type commands using GUI 138 of computer 136, although other control arrangements may be employed.

In any of the embodiments described above, any electrode pairs 110x, 110y, 110z utilized may be connected to a common reference point, which could be ground, if a ground is available, or could be a power supply line or a power supply common line or could be a vehicle structure. The common reference may be any reference point that is likely to be relatively fixed in potential relative to the potentials utilized by sensor system 100.

While the foregoing describes an embodiment comprising having six (three pair of) electrodes 110x-110x, 110y-110y, 110z-110z, and six (three pair of) auxiliary electrodes 500x-500x, 500y-500y, 500z-500z, such is not necessary. Typically any number of pairs of auxiliary electrodes that is less than or equal to the number of pairs of electrodes may provide a useful arrangement, and a greater number of auxiliary electrodes could be provided. For example, in a circumstance where the vertical field sensing electrodes 110z are omitted, it may be desirable to retain auxiliary electrodes 500z for directing the sensitivity for sensing non-vertical fields.

Figure 7:
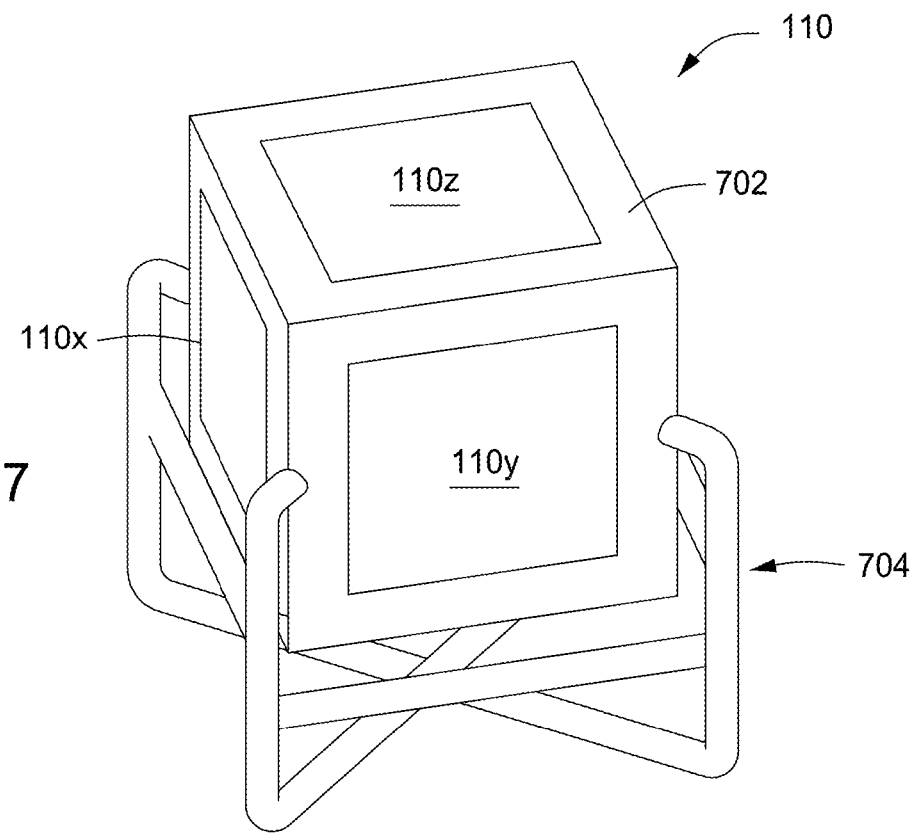
FIGS. 7-8 are illustrations of an isometric view of a tri-axial sensing probe arrangement mounted in a radar dome (radome) arrangement in accordance with some embodiments of the present invention.

FIG. 7 is a schematic diagram of a tri-axial DSU 110 mounted in a radar dome (radome) arrangement in accordance with some embodiments of the present invention. The electrodes 110x-110x, 110y-110y, 110z-110z may be positioned as if on the six surfaces of a cube, or may be supported by a cube-like structure 702. In addition, the cube-like structure may be additionally supported by a support structure 704. The cube-like structure 702 and support structure 704 may be constructed of any suitable material that would provide structural support and not interfere mechanically or electrically with the DSU 110. For example, the cube-like structure 702 or support structure 704 may comprise an insulating material, a dielectric plastic (e.g. PVC), Styrofoam™, urethane foam, wood, plywood, or the like. The support structure 704 may be employed to suspend the cube a sufficient distance from the vehicle carrying the DSU 110 or the ground surface so that the effects of movement of the cube, e.g., due to vehicle movement, surface (pavement) irregularities, vehicle suspension motion, and/or cube support movement, is relatively small relative to the distance from the vehicle and from the ground.

Figure 8:
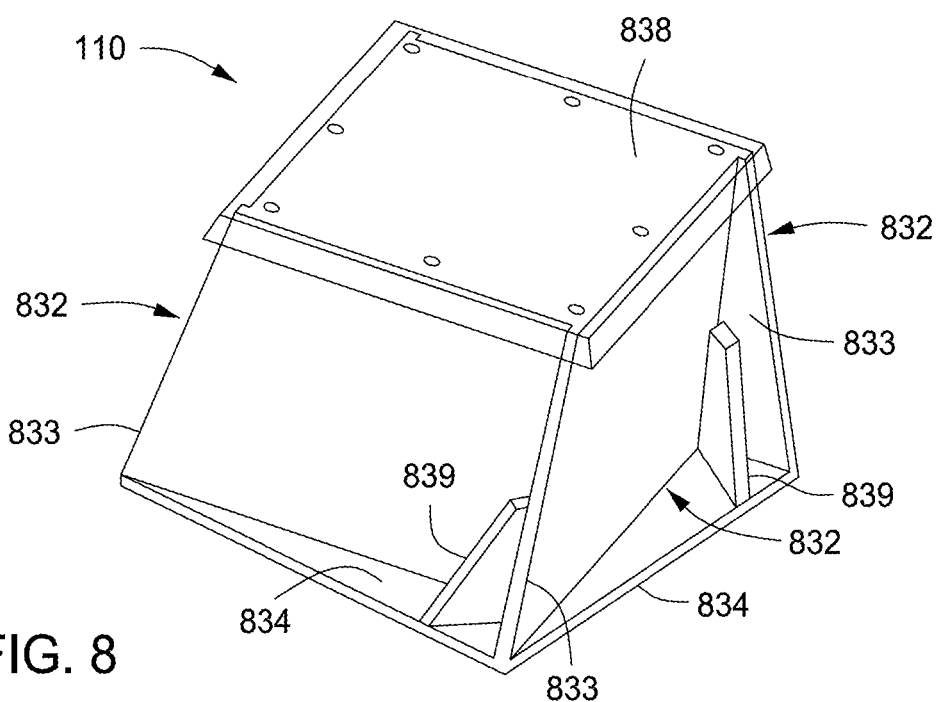
Figure 8A:
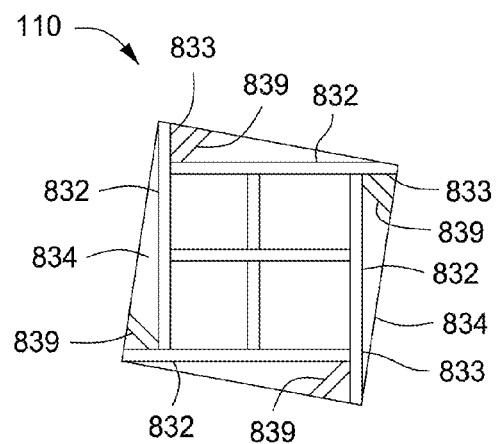
FIG. 8A is an illustration of a top view tri-axial sensing probe arrangement mounted in a radome arrangement in accordance with some embodiments of the present invention.

FIGS. 8-8A are schematic diagrams of an isometric view and a top view of a tri-axial DSU 110 mounted in a radome arrangement in accordance with some embodiments of the present invention. DSU 110 comprises four sides 832 joined at corners of a cube. Each of sides 832 is trapezoidal in shape comprising a square portion defining one side of a cube and a contiguous triangular portion 833 that serves as a stiffening member in conjunction with base 834 to which sides 832 are fastened. Base 834 is a square having a side length substantially the tip-to-tip dimension of adjacent sides 832, with the tips at the corners of base 834. A square top 838 is fastened to sides 832. Internal to DSU 110 are a pair of substantially rectangular stiffeners 836 that intersect substantially perpendicularly and are fastened at the mid-lines of respective sides 832, and to base 834 and top 838. Additional stiffeners 839 may be provided at the corners of DSU 110 at an angle inside the corners defined by stiffeners 833 and their respective adjacent sides 832.

In the embodiments described above with respect to FIGS. 7 and 8A-B, high input impedance amplifiers (not shown) associated with the three pairs of electrodes 110x-110x, 110y-110y, 110z-110z may be disposed within the cube defined by electrodes 110x-110x, 110y-110y, 110z-110z.

While a cubical arrangement of electrodes 110x-110x, 110y-110y, 110z-110z have been described above, other non-cubical arrangements may be employed, e.g., a rectangular solid or a spherical arrangement. Likewise, while square electrodes 110x-110x, 110y-110y, 110z-110z are shown, electrodes 110x-110x, 110y-110y, 110z-110z may be circular or rectangular or hexagonal or any other suitable shape.

Figure 9:
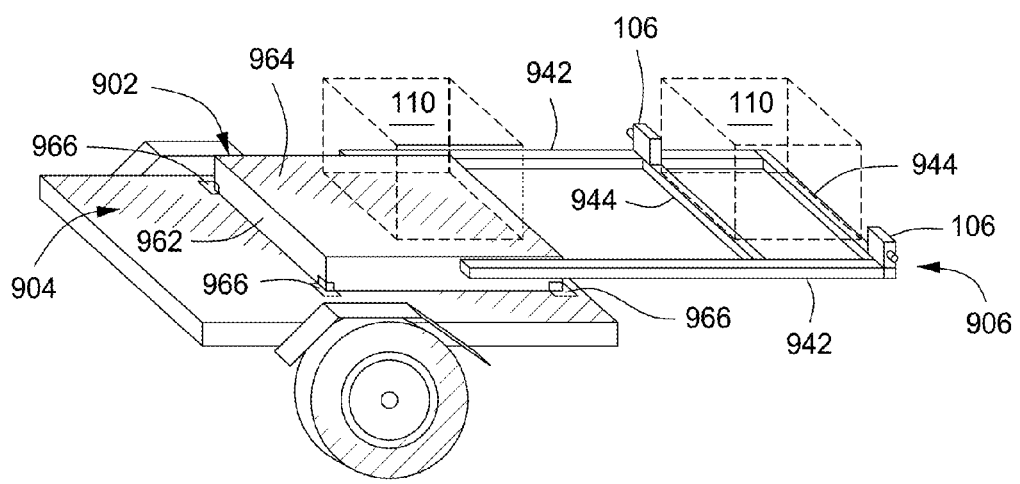
FIG. 9 is an illustration of a vehicle mounted DSU in accordance with some embodiments of the present invention.

In some embodiments, such as depicted in FIG. 9, the DSU 110 may be mounted on a support frame base 902 that is mounted to a vehicle, such as directly to a car or truck, or to a wheeled trailer 904 capable of being towed by a vehicle. The support frame base 902 may be constructed of any suitable material that would provide structural support and not interfere mechanically or electrically with the DSU 110, such as an insulating material, a dielectric plastic (e.g. PVC), wood, plywood, or the like. In some embodiments, the support frame base 902 may be constructed of wood to provide for a rigid structure, while also providing damping so that resonances near 60 Hz may be avoided. In some embodiments, other insulating materials may be employed consistently with the high-input impedance of differential pre-amplifiers for electrodes 110x-110x, 110y-110y, 110z-110z.

The support frame base 902 may comprise a compartmented frame 962 having a top and bottom faces which can be filled with ballast. The compartmented frame 962 may be filled with a sufficient amount of ballast to approach the load weight limit for the trailer 904, e.g., about 100 pounds below the weight limit, so as to reduce the natural frequency of the trailer 904 and its suspension. In some embodiments, support frame base 902 is mounted to the bed of trailer 904 by four optional vibration isolators 966 located respectively at each of the four corners of support frame base 902 so as to reduce the natural frequency well below 60 Hz, e.g., to about 12.5 Hz.

In some embodiments, support frame base 902 is mounted directly to the bed of trailer 904 and DSU 110 is cantilevered behind trailer 904 on a support structure 906 comprising at least one outrigger (two shown) 942 that extend rearward so that DSU 110 is positioned behind the trailer 904. In some embodiments, DSU 110 may be positioned sufficiently enough away from the trailer 904 as to eliminate or reduce interference from metal surfaces or electrical sources on the trailer 904. In some embodiments, DSU 110 is positioned from about 0.9 to about 1.6 meters (about 3 to about 5 feet) from the from the rear of support frame base 902 and trailer 904, and about 0.9 to about 1.6 meters (about 3 to about 5 feet) above the ground (e.g., pavement).

Outriggers 942 may further comprise at least one (two shown) transverse members 944 to provide additional strength. Rearward portions of trailer 904, such as the rear cross member, may be removed to further separate DSU 110 from metal that could distort the field being sensed.

In some embodiments, either fixed outriggers or telescoping or other form of collapsible outrigger or extension could be employed so that the DSU 110, may be moved closer to the vehicle (i.e. stowed) for transit and farther from the vehicle (i.e. deployed) for operation to facilitate adjusting the sensitivity of DSU 110.

While a vehicle-borne sensor system 100 is described, it is contemplated that apparatus employing the arrangements and methods described herein may be provided in a case or backpack that could be carried by a person. In such embodiments, computer 136 may be a personal digital assistant or other small device.

FIGS. 10-21 illustrate exemplary displays that may be provided on video display of GUI 138 for monitoring and controlling the operation of sensor system 100, in accordance with some embodiments of the present invention. To best understand the invention, the reader should refer to FIGS. 10-21 simultaneously.

Figure 10:
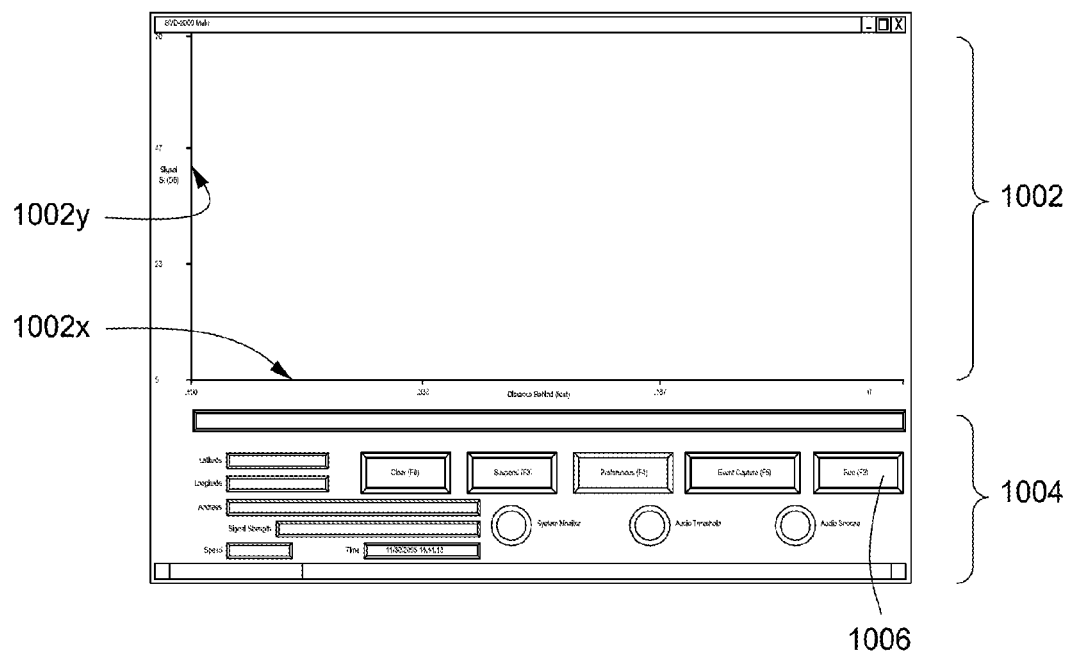
FIG. 10 is an exemplary screen display of a graphical computer interface in accordance with some embodiments of the present invention.

As previously described, GUI 138 may be provided on a computer 136. Upon start up of GUI 138 of sensor system 100, for example, by selecting or clicking an icon displayed on the "desktop" provided on a monitor display of a computer 136, a computer program for providing GUI 138 will initialize a main display 1000, as illustrated in FIG. 10. The GUI 138 may run on a computer 136 running any suitable operating system, such as Microsoft Windows®, Linux®, Ms-Dos®, Mac Os®, or the like, for providing visual or audible information regarding the sensing of stray voltage anomalies in an electric field relative to a user selected manual threshold value or an automatically determined threshold value.

Main display 1000 provides an interface user with a real-time monitoring environment of the area being patrolled for stray voltage anomalies. Main display 1000 may be comprised of a video display 1002 and a control panel 1004. Real-time electric field measurements and video frames of the patrolled environment may be provided in video display 1002, which is supplemented with a graphical plot having an x-axis 1002$x$ indicative of the linear distance traveled by the patrol vehicle versus a y-axis 1002$y$ indicative of the signal strength of the measured electric field associated with various locations of the patrol vehicle. In order to initiate the detection and monitoring system of sensor system 100, the interface user may select a run command option 1006 provided on main display 1000.

Run command option 1006, when selected, will prompt for information to be entered in an initial identification screen. The initial identification screen may be, for example, system login display 1100 of FIG. 11. System login display 1100 may request an the interface operator to provide a username in field 1102, a patrol vehicle name in field 1104 and a patrol vehicle number in field 1106 for purposes of authorizing access to the operational and monitoring controls of sensor system 100. When the required information has been provided by the interface operator in fields 1102, 1104 and 1106, the interface operator may then select login command option 1108 to proceed with system verification of authorized access to sensor system 100. Similarly, the interface operator may select cancel command option 1110 to terminate login procedures for sensor system 100.

Figure 12:
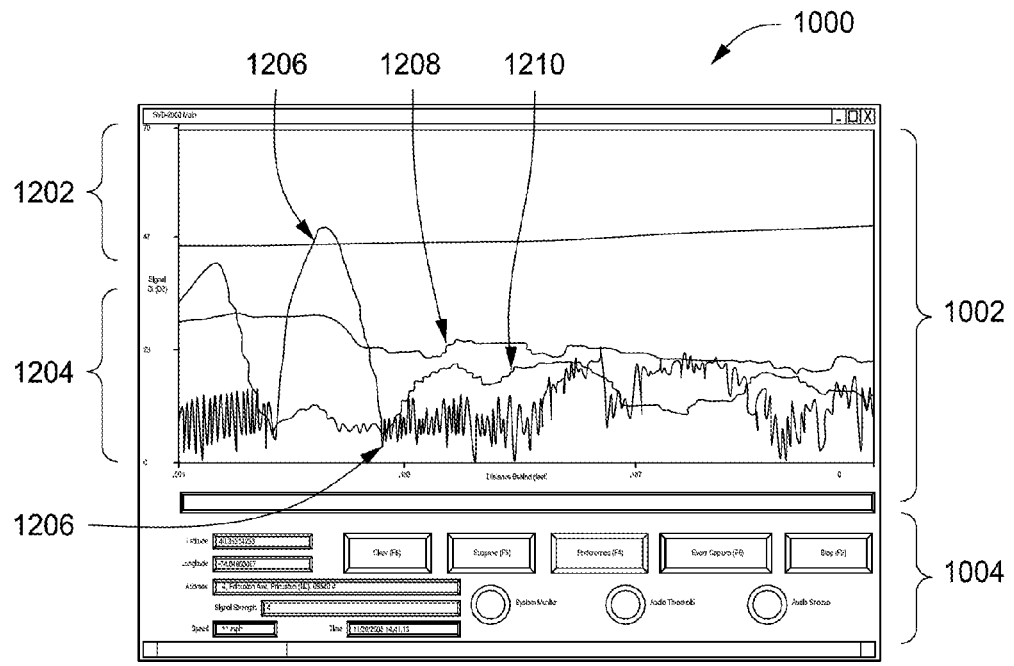
FIG. 12 illustrates an exemplary main display of the graphical user interface populated with sensor data in accordance with some embodiments of the present invention.
Figure 13:
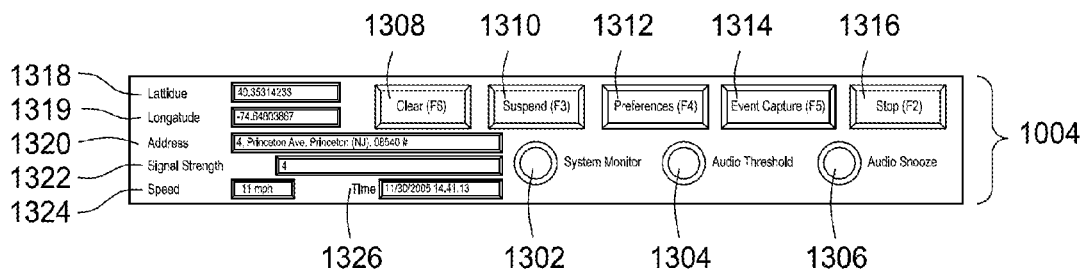
FIG. 13 illustrates an enlarged view of the control panel of the main display of the graphical user interface in accordance with some embodiments of the present invention.

Upon a successful login at display 1100, data sampling is initiated and main display 1000 is populated with sensor data, as illustrated in the main display 1000 of FIG. 12. Sensor data is provided on video display 1002, which may be provided in a split screen format for displaying multiple video image frames (one from each camera). Multiple split screen views 1202, 1204 may display video image frames received from one or more cameras contained in the ISU 106. For example, as described above with respect to FIG. 1, a patrol vehicle may be equipped with two cameras positioned on opposing sides for providing corresponding video image frames from both sides of the patrol vehicles path of travel. Although main display 1000 of FIG. 12 is shown with two split screens 1202 and 1204, additional split screens may be incorporated into video display 1002 to facilitate the utilization of more than two cameras.

Three plot lines, a raw electrical field measurement plot 1206, an adaptive threshold plot 1208 set relative to the local ambient or background noise level and a smoothed plot 1210 are provided in conjunction with the graphical plot overlaid on the video image frames displayed on video display 1002. Adaptive threshold plot 1208 is generated from data gathered before and after the raw voltage was sensed by the DSU 110. Smoothed plot 1210 is a smoothed version of raw electrical field measurement plot 1206 that has been filtered to remove spurious content. A potential stray voltage is indicated when smoothed plot 1210 exceeds adaptive threshold plot 1208.

Control panel 1004 of main display 1000 provides the interface operator with a plurality of monitoring and control options. An enlarged view of control panel 1004, as illustrated in FIG. 12, is provided and described with respect to FIG. 13. Control panel 1004 may include a system monitor indicator 1302, an audio threshold indicator 1304 and an audio snooze indicator 1306. In addition, a clear command option 1308, a suspend command option 1310, a preferences command option 1312, an event capture command option 1314 and a stop command option 1316 are provided to the interface operator in control panel 1004. Control panel 1004 may also provide information in a latitude display 1318, a longitude display 1319, an address display 1320, a signal strength display 1322, a speed display 1324 and a time stamp display 1326.

Indicators 1302, 1304 and 1306 may be visual indicators, configured to change color or blink upon satisfaction of preprogrammed criteria. System monitor indicator 1302 may be a green color when operating within system specifications. When a problem is detected in connection with GUI 138, system monitor indicator 1302 may turn yellow to notify the interface operator that there exists a problem, such as, lack of a GPS signal. In this case, no latitude, longitude or address information may be shown, respectively, in displays 1318, 1319 and 1320. Another potential trigger indicative of a problem is lack of video or electric field measurement data, wherein there would be no video image frame or measurement readings on video display 1002. Other potential problems that may trigger indicator 1302 may be depleted disk space for recording captured events (described in detail below) or loss of communication between DPS 112 and GUI 138.

Generation of an audible tone output signal having a pitch that is proportional to the signal strength of the measured electric field may be provided as a tool in conjunction with the monitoring capabilities provided in GUI 138 to aid the interface operator in determining the source and potential danger of stray voltage anomalies. In some embodiments, the audio threshold value is indicative of the minimum voltage level required to trigger an audible notification tone. For example, an optimum audio alert value for identifying stray voltage anomalies, while minimizing the number of false detections, may be preset as a default value. Default settings may be represented by audio threshold indicator 1304 being, for example, a green color.

Figure 14:
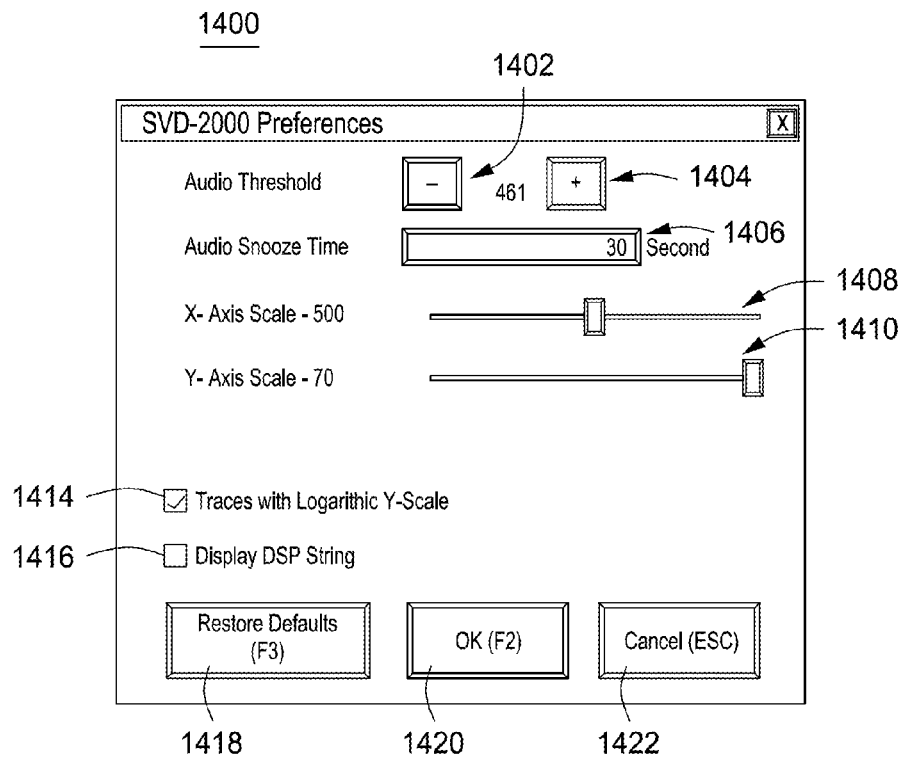
FIG. 14 illustrates an exemplary preferences display produced by the graphical user interface upon selection of a preferences option in accordance with some embodiments of the present invention.
Figure 15:
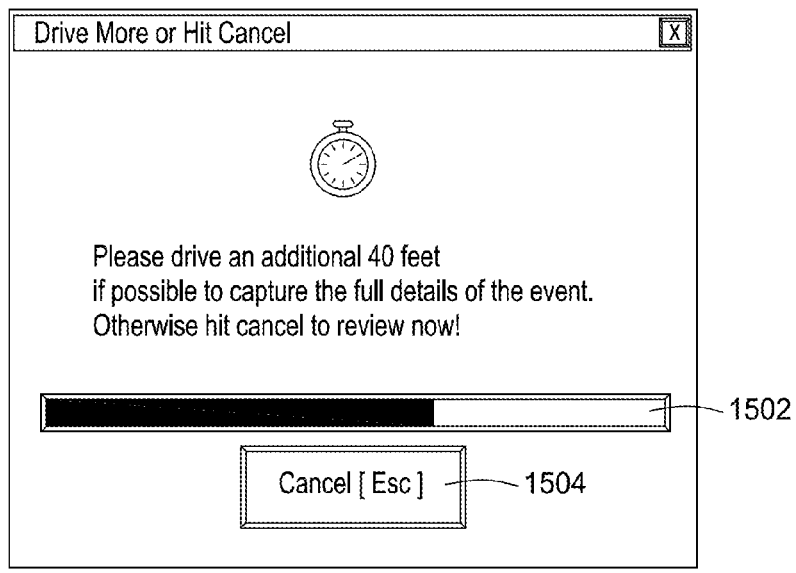
FIG. 15 illustrates an exemplary standby display produced by the system upon selection of an event capture option provided on the main display in accordance with some embodiments of the present invention.

However, the interface operator may adjust the default threshold settings provided in connection with the audible notification tone if an excess amount of background noise interferes with accurate or efficient notifications. By selecting preferences command option 1312 provided on control panel 1004, the interface operator could be provided with a preferences display 1400, as illustrated in FIG. 14, for modifying values associated with the audible tone. Therein, the interface operator could raise the threshold value, using audio threshold increase button 1402 and decrease button 1404, to minimize or eliminate false audible tones being generated due to a noisy environment in a patrolled environment. Any changes made to the default audible threshold value in preferences display 1400 may be represented by audible threshold indicator 1304 on control panel 1004 turning yellow. The change in color informs the interface operator that the audible notification tone is operating according to user defined values, not system defined default values.

Additional features that may be provided in preferences display 1400 of FIG. 14, may be an audio snooze time option 1406, an x-axis toggle switch 1408, a y-axis toggle switch 1410, a trace option 1414 and a DSP string option 1416. Audio snooze time option 1406 specifies in seconds how long audio alerts are suspended when a snooze button 1306 is pushed. Snooze button 1306 may be green when default values are provided in the display of snooze time option 1406 of preferences display 1400. However, similar to audio threshold indicator 1304, snooze button 1306 may also include a color indicator that changes, for example, to yellow when the default snooze time has been changed in preferences display 1400. Toggle switches 1408 and 1410 permit the interface operator to adjust, respectively, the scale used in x-axis 1002x, which measures in feet the distance traveled since the last event capture, and y-axis 1002y, which measures in decibels the electric field signal strength, on video display 1002. Trace option 1414, when selected, allows for the logarithmic scaling of all y-axis 1002 values in order to ensure that values are easily readable and that entire plot lines appear within video display 1002 of main display 1000. DSP string option 1416 may be provided as a means for displaying processing related data, when selected, to troubleshooting sensor system 100.

Default values for system preferences identified in display 1400 may be restored by selecting a restore defaults command option 1418. Otherwise defined preferences may be saved and executed by selecting an "OK" command option 1420. Alternatively, if the interface operator decides not to make any changes, then a "CANCEL" command option 1422 may be selected. Selection of either command option 1420 or 1422 will return the interface operator to display 1000.

As the patrol vehicle traverses through an environment, streaming synchronized data of the electric field strength overlaid on the corresponding video frames of the scene being traversed at the time of measurement may be displayed to the interface operator on video display 1002 of main display 1000. In addition, corresponding latitude and longitude information related to the patrolling vehicle is received by GPS receiver 142 and provided, respectively, to display fields 1318 and 1319. An address corresponding to the latitude and longitude readings provided in display fields 1318 and 1319 may also be provided in display field 1320. A signal strength value may be provided in display field 1322. The speed of the patrol vehicle may be presented in display field 1324, along with a current data and time stamp in display field 1326. The interface operator may temporarily suspend data sampling at any time by selecting a suspend command option 1310, clear received data by selecting a clear command option 1308 or exit GUI 138 system entirely by selecting a stop command option 1316 provided on control panel 1004 of main display 1000.

As the interface operator monitors the incoming streaming data on video display 1002, he/she is also presented with a variable-pitch alert that is configured for alerting the interface operator of detected fluctuations and/or spikes in measured electric field readings that exceed a defined threshold. Therefore, when a potential anomaly is detected, represented for example by a rise-peak-fall in the alert pitch, a corresponding visual spike in raw voltage plot 1206, a high signal strength value in signal strength display field 1322 or a combination thereof, interface operator may select an event capture command option 1314 for purposes of gathering additional information to review the potentially detected stray voltage anomaly. Therefore, when the interface operator selects event capture command option 1314 on control panel 1004 of main display 1000, he/she may be presented with a data collection display 1500 and a event capture display 1600 illustrated, respectively, in FIGS. 15 and 16. Data collection display 1500 prompts the interface operator to continue driving the patrol vehicle for a predefined distance (e.g., an additional 40 feet after selection of event capture command option 1314) in order to collect enough data sampling information to fully analyze the background noise associated with the captured event. A progress bar 1502 may be provided in display 1500 to inform the interface user of the remaining distance of travel required. Upon completion of the additional information collection process, represented by progress bar 1502, the interface operator may stop the collection of streaming data by GUI 138 and proceed to event capture display 1600 for analyzing the captured event. The collection of streaming data may be stopped or paused by stopping the patrol vehicle. Alternatively, collection of additional information pertaining to the captured event may be optionally terminated earlier, through selection of a cancel command option 1504, to permit the interface operator to proceed to review the captured event on event capture display 1600 without collection of additional information.

Figure 16:
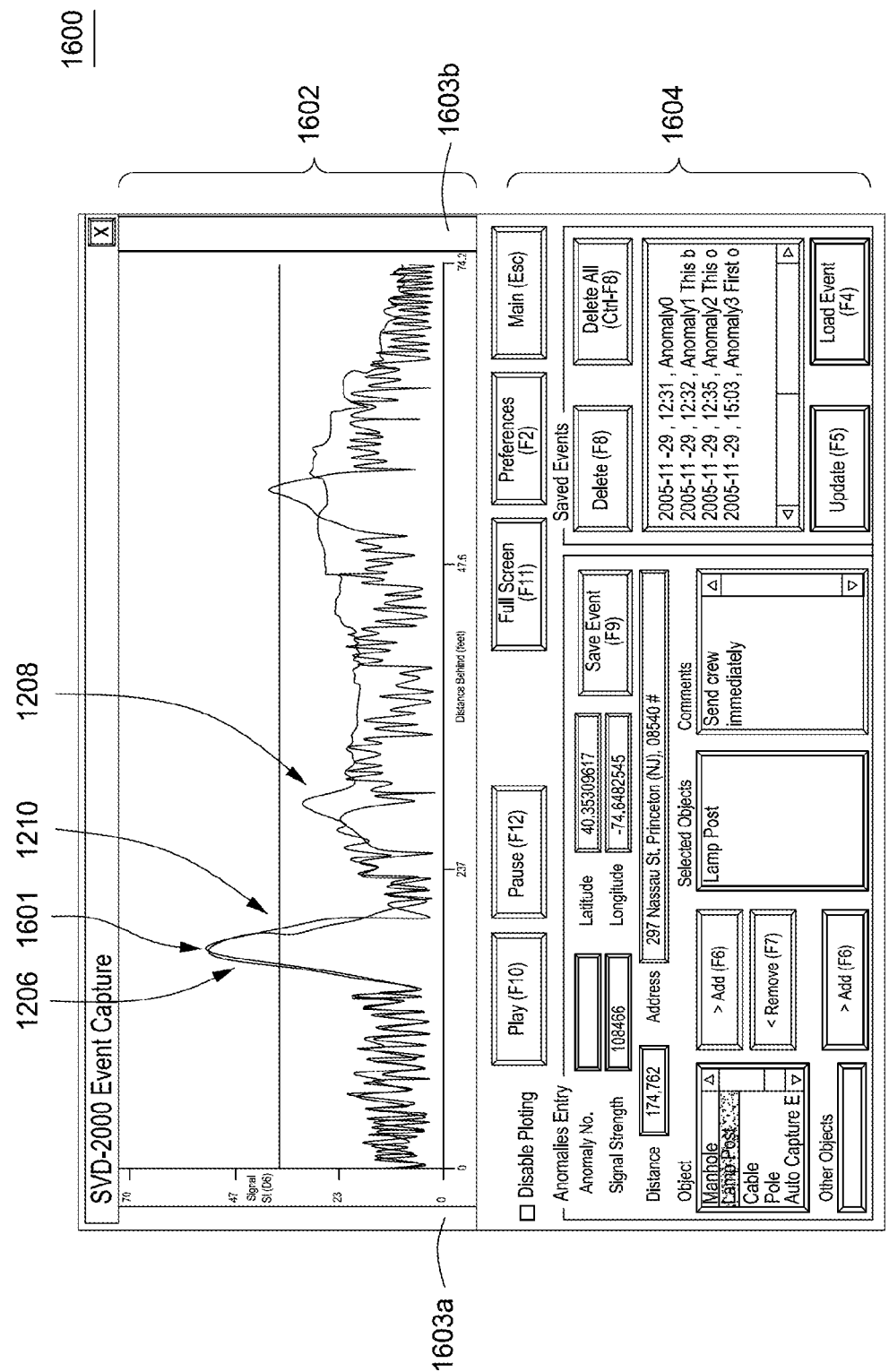
FIG. 16 illustrates an exemplary event capture display produced by the system upon completion of the processing for a request to capture an event in accordance with an embodiment of the present invention.

After driving the additional distance prompted by display 1500 and stopping the patrol vehicle, processing of data related to the event capture may be processed (e.g. by DSU 110) and a second distinctive alert tone (e.g., a chime-like sound) may be presented to the interface operator if it is determined that the processed captured measurement is not a false alarm. Thereupon, the interface operator could further examine the potential detected anomaly in event capture display 1600, as illustrated in FIG. 16. Similar to main display 1000, event capture display 1600 provides a video display 1602 and a playback control panel 1604. Scene scroll tabs 1603a and 1603b may be provided on opposing sides of display 1602 to permit the interface operator to view captured video images and their corresponding electric field measurements throughout various positions traversed by the patrol vehicle. Event capture display 1600 may also provide a pinpoint indicator 1601 that may be positioned on any part of the video display 1602 to display data and video for a different location. Data displayed in playback control panel 1604 (described below) corresponds to the applied position of indicator 1601. For example, if the interface operator would like to view measurement and video data associated with a position 225 feet prior in motion, the interface operator could use scene scroll tabs 1603a and 1603b to move pinpoint indicator 1601 to the desired location on video display 1602.

Event capture display 1600 allows the interface operator to more closely examine potentially detected anomalies by providing playback analysis of the captured event. More specifically, the interface operator may compare raw voltage plot 1206 and adaptive threshold plot 1208 to assist in identifying the object displayed in the corresponding image frame that is most likely to be the source of the anomaly. In event capture display 1600, the three plot lines may be aligned to permit the interface operator to look for points where smoothed plot 1210 exceeds adaptive threshold plot 1208. This indicates that there exists a spike above the averaged background noise and, therefore, the existence of an anomaly.

Figure 17:
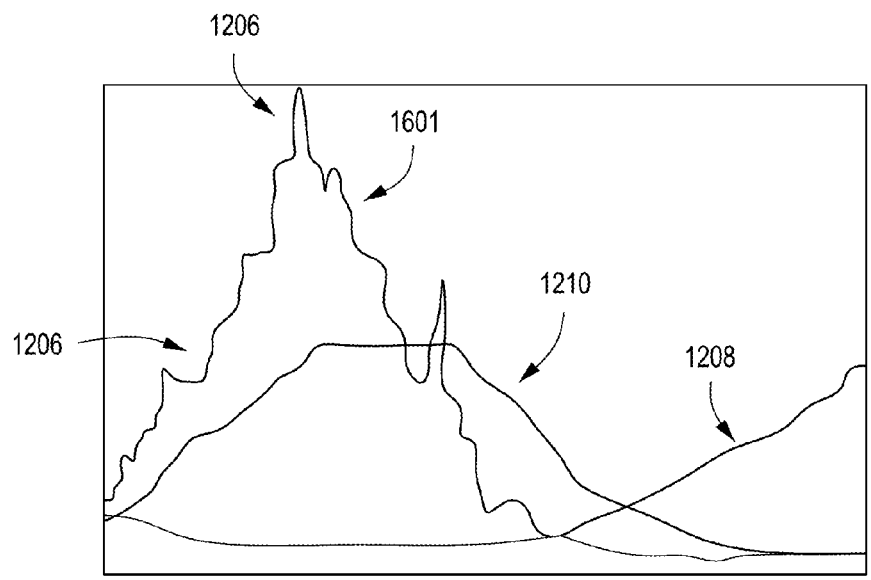
FIGS. 17-18 illustrate an enlarged view of a detected stray voltage anomaly as it may be provided on the exemplary event capture display.
Figure 18:
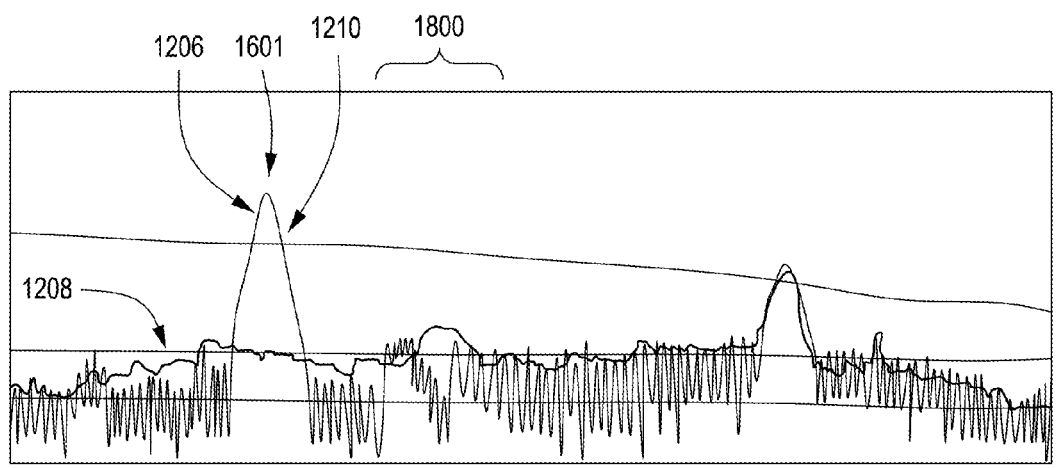

Enlarged views of a detected stray voltage anomaly as it may be provided on video display 1602 of event capture display 1600 of FIG. 16 is illustrated in conjunction with FIGS. 17-18. In FIG. 17, pinpoint indicator 1601 is positioned near the peak of spike in raw voltage plot 1206. All related sensor data related to this particular position is provided to the interface operator on playback control panel 1604. As can be seen near the spike in raw voltage plot 1206, smoothed plot 1210 exceeds adaptive threshold plot 1208, indicative of a potentially dangerous anomaly in the captured scene. When pinpoint indicator 1601 is positioned over the peak of a spike, the object most centered in a video frame on video display 1602 is likely the source of the detected anomaly. An isolated enlarged view, as illustrated in FIG. 18, of the video image frame shown on video display 1602 of event capture display 1600 may be provided, wherein it can be seen that an object 1800 most centered in the video frame is likely the source of the detected anomaly. The video image frame may be isolated and enlarged by selecting a full screen command option 1906 (described below with respect to FIG. 19) from playback control panel 1604.

Figure 19:
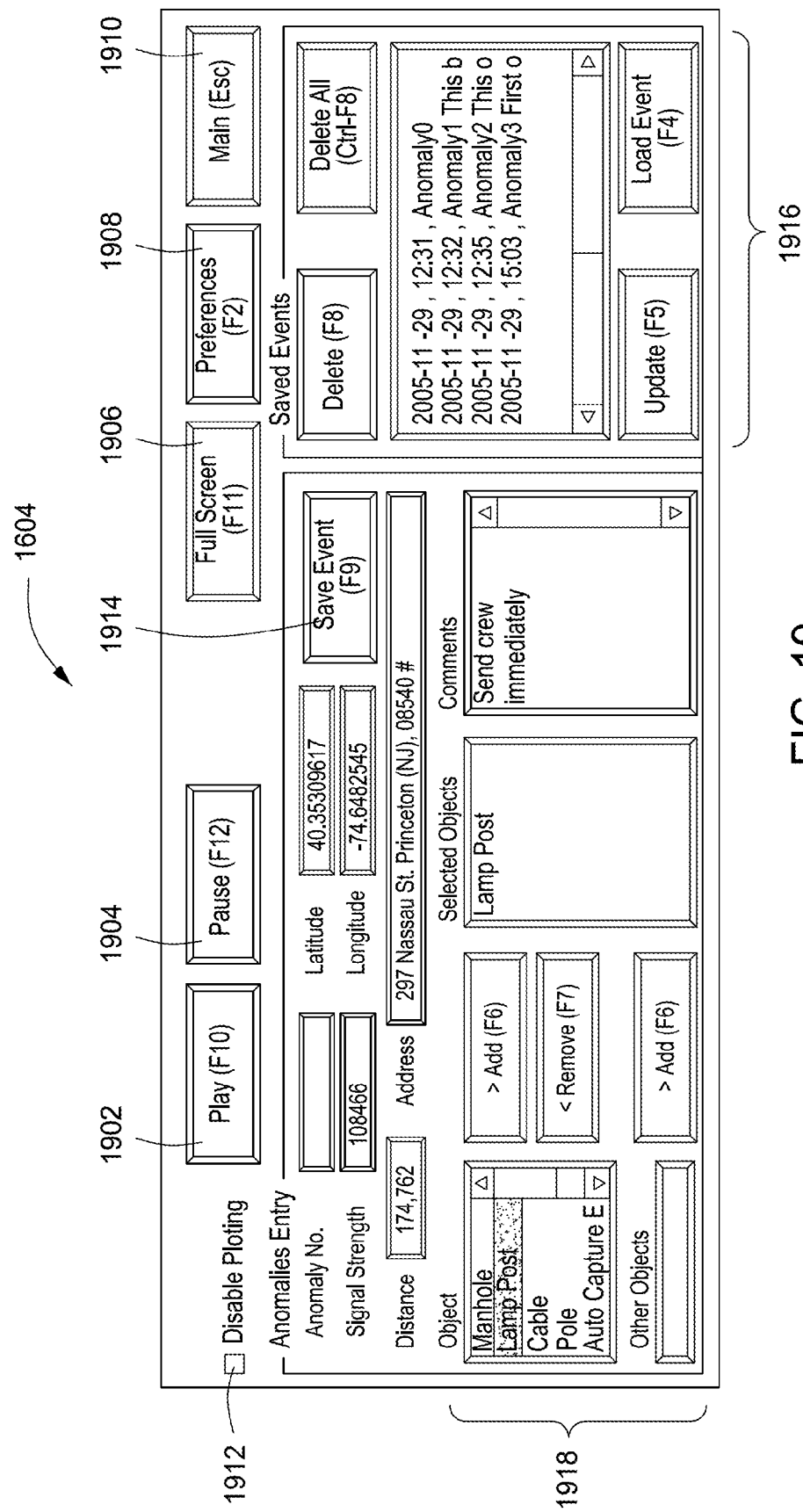
FIG. 19 illustrates an enlarged view of a playback control panel of the event capture display in accordance with some embodiments of the present invention.

An enlarged view of event capture control panel 1604 is illustrated in FIG. 19. Event capture control panel 1604 is comprised of a play command option 1902, a pause command option 1904, a full screen command option 1906, a preferences option 1908 and a main display option 1910. Play command option 1902 may allow the interface operator to play a video clip selected from a saved events section 1916. Similarly pause command option 1904 may allow the interface operator to pause playback of the video clip selected from saved events section 1916. Full screen command option 1906 may allow the interface operator to toggle between full-sized video images and regular-sized video images provided. Preferences command option 1908 may provide the interface operator with additional playback and review options not shown on playback control panel 1604. For example, command option 1908, when selected, may provide preferences related to wireless communication of captured events to dispatch a remote crew. Main display option 1910 may allow the interface operator to return to main display 1000. A disable plotting option 1912 may also be provided, wherein the plots may be removed for a clearer view of scene objects displayed on video display 1002 when option 1912 is selected.

Figure 20:
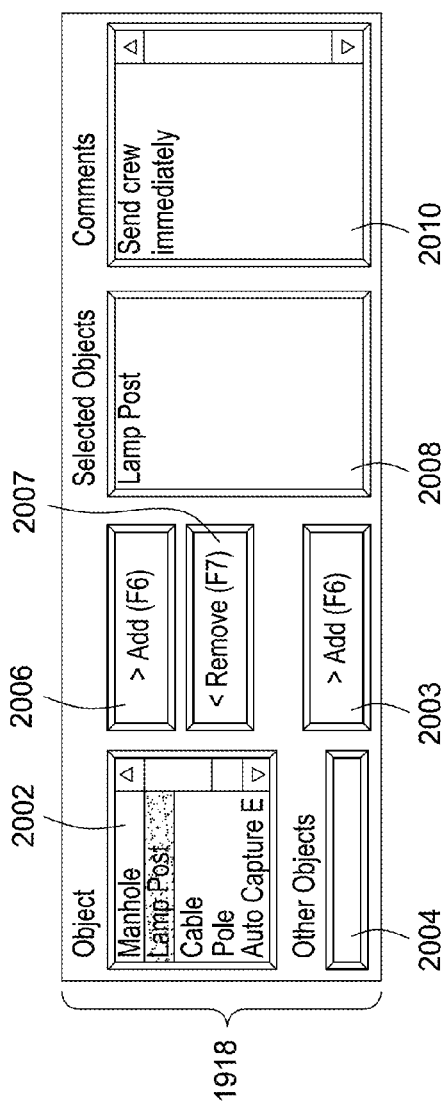
FIG. 20 illustrates an enlarged view of an objects election section of the playback control panel in accordance with some embodiments of the present invention.

Once a detected stray voltage anomaly has been confirmed by the interface operator and an object has been determined to be the likely source of the anomaly, the interface operator may then proceed to record object related information in an objects section 1918 of playback control panel 1604. FIG. 20 provides an enlarged view of objects section 1918. An environmental object or infrastructure name may be listed in a predefined objects scroll menu 2002 or may be defined by the interface operator using an object identification field 2004. The interface operator may then add the object identified in predefined objects scroll menu 2002 or object identification field 2004 to a selected object field 2008 using, respectively, an add command option 2006 or an add command option 2003. An added object identified in selected object field 2008 may also be removed by selecting a remove command option 2007. Additional notes, comments and instructions may be provided by the interface operator using a comments field 2010. For example, the interface operator may identify a lamp post, in selected object field 2008, as the potential source of a detected stray voltage anomaly and instruct, in comments field 2010, the need for a utility crew to be dispatched immediately to the site to neutralize the source. In addition, GUI 138 is configured so that if multiple objects are determined to be present in a scene where an anomaly was detected, the interface operator may identify the multiple objects in selected object field 2008. The interface operator may then select a save event command option 1914 to record the identified object source of the anomaly, associated comments regarding the anomaly and anomaly location information for future reference and analysis of the captured anomaly event in the saved event section 1916. Thereafter, the interface operator may return to main display 1000, via command option 1910, and restart movement of the patrol vehicle to restart data sampling of the scene being traversed.

Figure 21:
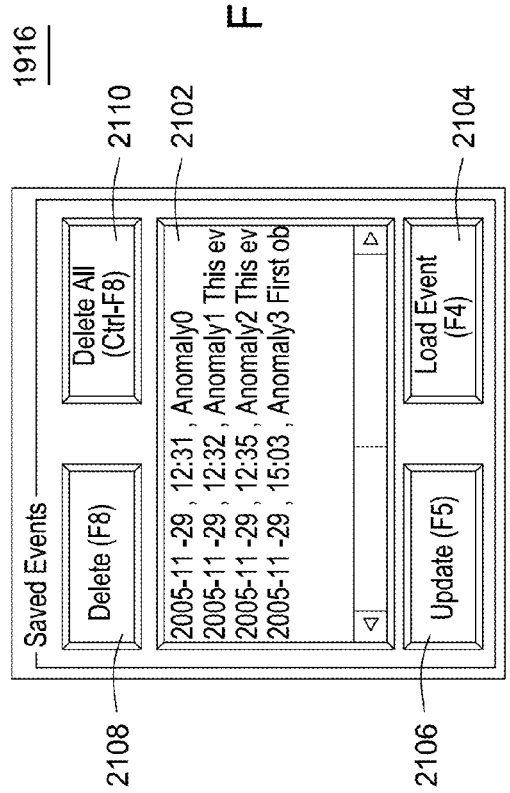
FIG. 21 illustrates an enlarged view of a saved events section of the playback control panel in accordance with some embodiments of the present invention.

FIG. 21 is an enlarged view of the saved events section 1916. Captured events that have been previously saved by the interface operator may be viewed in the saved events section 1916 by selecting a saved event file from the event listing 2102. To open a saved event provided in event listing 2102, the interface operator, or any other applicable user, may select the desired event and then select a load event command option 2104. When the desired event is loaded, display 1600 is populated with all data related to the selected event (e.g., location information, object identification, comments, captured video image frame and corresponding measurement data). To play the video associated with a loaded event, the interface operator may move the pinpoint indicator 1601 to the desired starting location on video display 1602 in which he/she wishes to begin viewing and select play command option 1902.

Information that has been populated, for example, into objects section 1918 may be edited. For instance, if it is determined that an object previously identified as the source of a stray voltage anomaly is not indeed the source of the anomaly, selected objects field 2008 may be edited using commands 2006 and 2007 to, respectively, add a new source and remove the inaccurate source. Once changes have been made, the interface operator may select an update command option 2106 to have the new information saved in connection with the previously saved event.

When an event is saved, GUI 138 may be configured to generate a database entry for the saved event and create separate files for video and corresponding sensor related data. For example, GUI 138 may be configured to create an AVI file for storing video images and an XML file for storing all other sensor related data. These files may be saved on a hard disk (e.g., memory component) and retrieved when the corresponding event is selected and loaded using playback control panel 1604 on event capture display 1600. If it is determined that saved events are no longer needed or have been archived elsewhere, or alternatively, if additional storage space is needed, the interface operator may delete using command options 2108 and 2110 provided on saved events section 1916 of playback control panel 1604.

Figure 11:
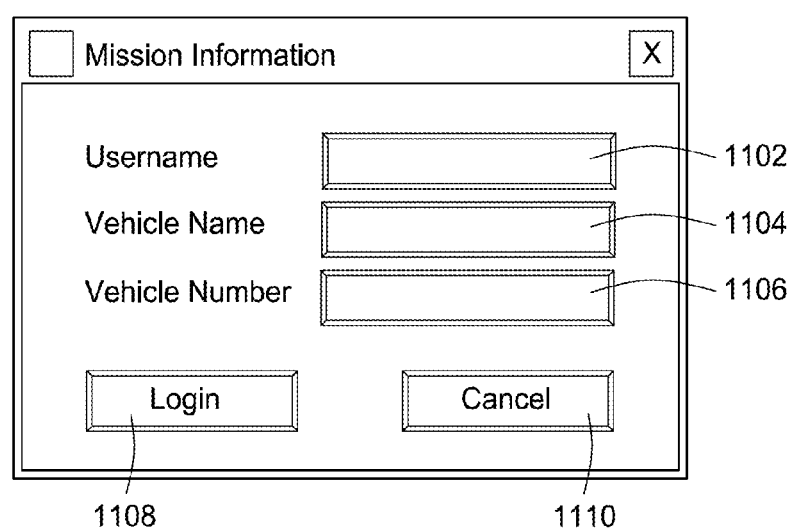
FIG. 11 illustrates an exemplary login display of the graphical user interface in accordance with some embodiments of the present invention.

An illustrative depiction of the general steps employed in use of GUI 138 of sensor system 100 for monitoring and controlling the detection of a stray voltage anomaly is described with reference to the flowchart of FIG. 22. As previously described, the monitoring of streaming data displayed on video display 1002 of GUI 138 is initiated, at step 2202, by providing user login information at step 2204. If the login information provided at display 1100 of FIG. 11 is determined to be for an authorized user, then GUI 138 may begin to sample data and provide a visual output of streaming data, at step 2208, on main display 1000, which may be driven by movement of the patrol vehicle equipped with sensor system 100.

GUI 138 of sensor system 100 may audibly, via a variable-pitched alert tone, and visually, via a spike in plots provided on graphical video display 1002, prompt the interface operator upon detection of a stray voltage anomaly at step 2210. When initial detection of a potential anomaly is detected at step 2210, interface operator may decide to capture the event by selecting event capture command option 1314 provided on control panel 1004 of main display 1000 at 2214. In response to the user initiated instruction to capture an event, additional processing may be executed to collect additional information about the captured event and an additional alert notification may be provided to the interface operator at 2216, indicating to the interface operator that the subsequent processing of the captured event is likely a stray voltage anomaly.

Playback controls are provided to the interface operator, at step 2218, via control panel 1604 on event capture display 1600 of FIG. 16. After the interface operator has had an opportunity to review information related to the captured event, as well as identify the source emitting the stray voltage anomaly, he/she may record the event at step 2220. Thereafter, the interface operator may elect to resume data sampling of the area being patrolled at 2224, thereby reinitiating the receipt of streaming data at main display 1000. GUI 138 may go into a standby mode, at step 2226, if no action is taken after a predetermined amount of time or, alternatively, if the interface operator elects to suspend data sampling by selecting, e.g., suspend command option 1310 on control panel 1004 of main display 1000.

Figure 23:
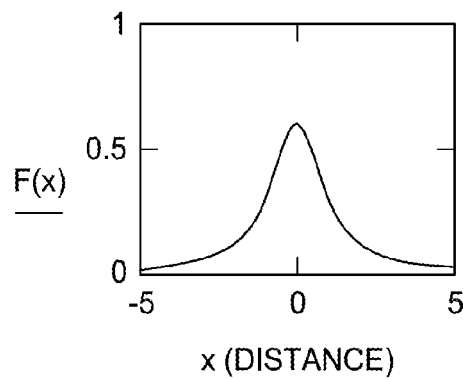
FIG. 23-23A are illustrations of a electric field profile detected by the DSU in accordance with some embodiments of the present invention.
Figure 23A:
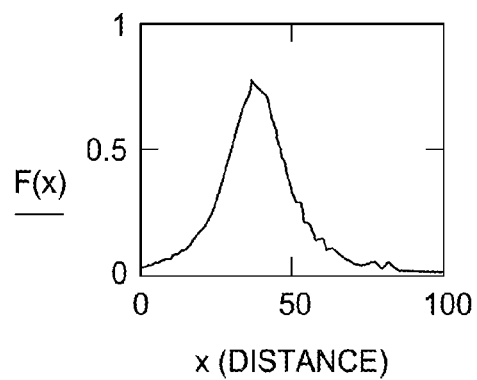

FIGS. 23 and 23A are graphical representations of a theoretical electric field profile and a measured electric field profile, respectively. The abscissa thereof represents distance x (in arbitrary units) and the ordinate thereof represents normalized electric field as a function of distance F(x).

The output signal from DSU 110 described herein may contain a considerable amount of noise due to detection of background 60 Hz electric field. Due to the motion of DSU 110 in this background field, the amplitude of the background noise signal produced thereby is constantly changing, even when the strength of the background electric field is constant. Further, movement of the DSU 110 in any electric field (even a static field, such as one generated by the air flow over the surface of a vehicle tire) results in modulation of such field and, in general, in the generation of a phantom 60 Hz signal. Under such circumstances, discriminating between a legitimate stray voltage electric field and background noise becomes difficult and requires prolonged training of the operator, combined with a high level of operator concentration during the operation of the equipment.

A method for automatically discriminating between a legitimate stray voltage signal and background noise can supplement the processing and reduce the stress imposed on the operator. The method described is based on Coulomb's law, which states that the magnitude of the electric field of a point charge is directly proportional to the charge (Q) and indirectly proportional to the square of distance (r) from the point charge: $E=kQ/r^2$, wherein proportionality is indicated by a selectable constant (k).

Considering the geometry, where the DSU 110, passes the point charge on a straight line at a minimum distance of R (either directly above the point charge or on the side of the charge or both), the electric field magnitude as a function of distance x from the closest approach (x equals 0) is given by: $E(x)=kQ/(R^2+x^2)$.

Figure 22:
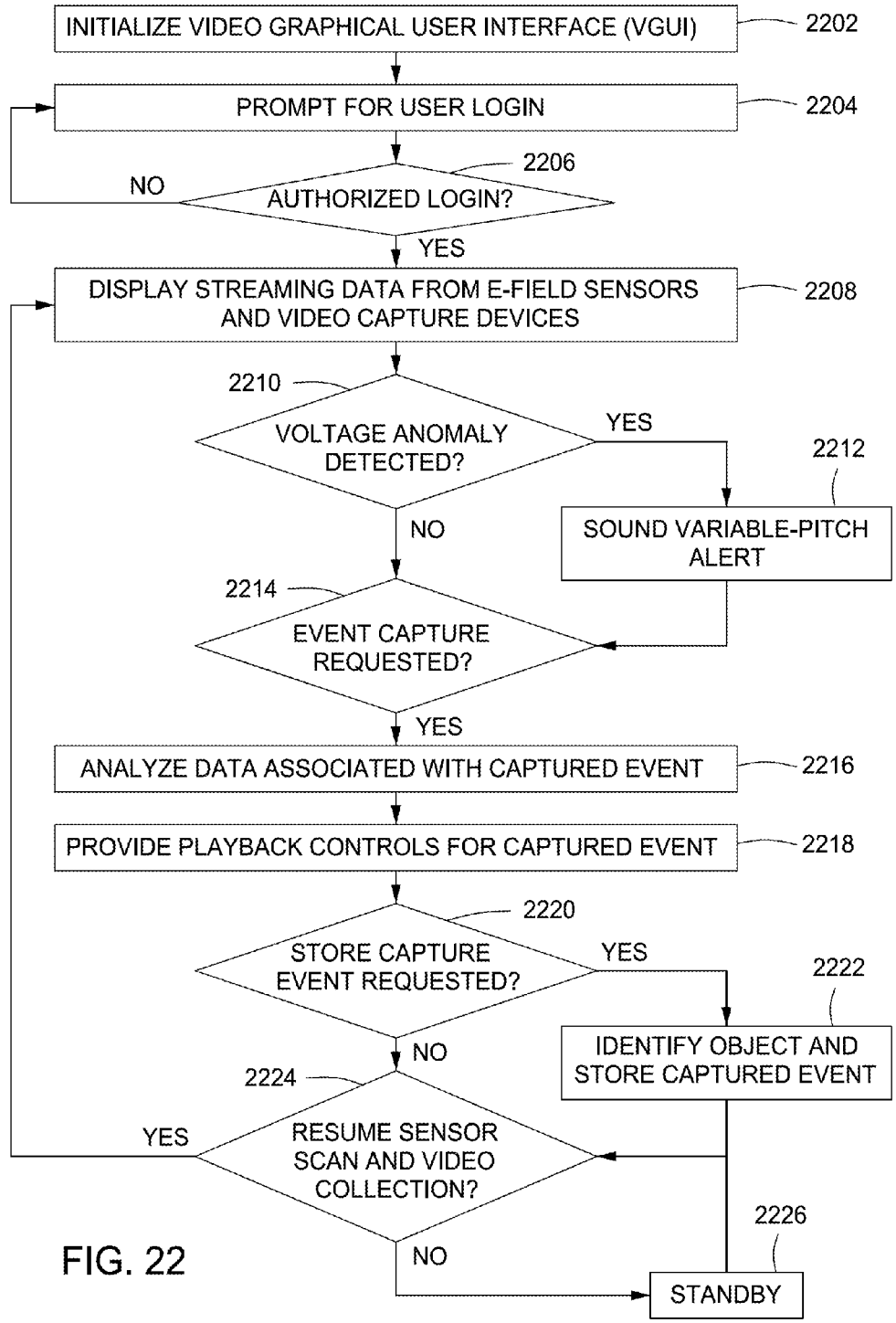
FIG. 22 is a flowchart illustrating the steps employed by the system in monitoring electric fields in accordance with some embodiments of the present invention.

Qualitatively, the theoretical electric field profile F(x) as the DSU 110 passes by is depicted in FIG. 22 and is in very good agreement with actual measurements of electric field profile F(x) as shown in FIG. 23A that were made using a DSU 110 as described herein.

Although the location of the source of a stray voltage anomaly or condition is not known, the characteristic of the observed electric field variation F(x) in time remains the same and thus, if it is normalized with respect to time and amplitude, it can be discriminated from other temporal signal fluctuations (noise). Normalization in time is accomplished by varying the rate at which the Fast Fourier Transform (FFT) of the sensed electric field is re-performed as a function of the lateral speed of the DSU 110, e.g., the speed of the vehicle on which DSU 110 is mounted. Normalization in amplitude is accomplished by observing the ratio between the amplitude of a fresh sample of the sensed electric field and a running average from the amplitudes of all past samples thereof.

Specifically, normalization in time is accomplished by varying the frequency at which the FFT is performed, such as performing one FFT per unit of travel of the DSU 110. For example, one FFT could be performed per every unit of distance (e.g., a foot or meter) of travel, e.g., as measured by the wheel speed sensor 144 sensing wheel 146 rotation or by a distance measuring wheel. Preferably, the time period between FFT sampling should be rounded such as to be an integer multiple of the period of the monitored electric field signal (in this example, an integer multiple of 1/60 sec. for a 60 Hz signal).

Figure 24:
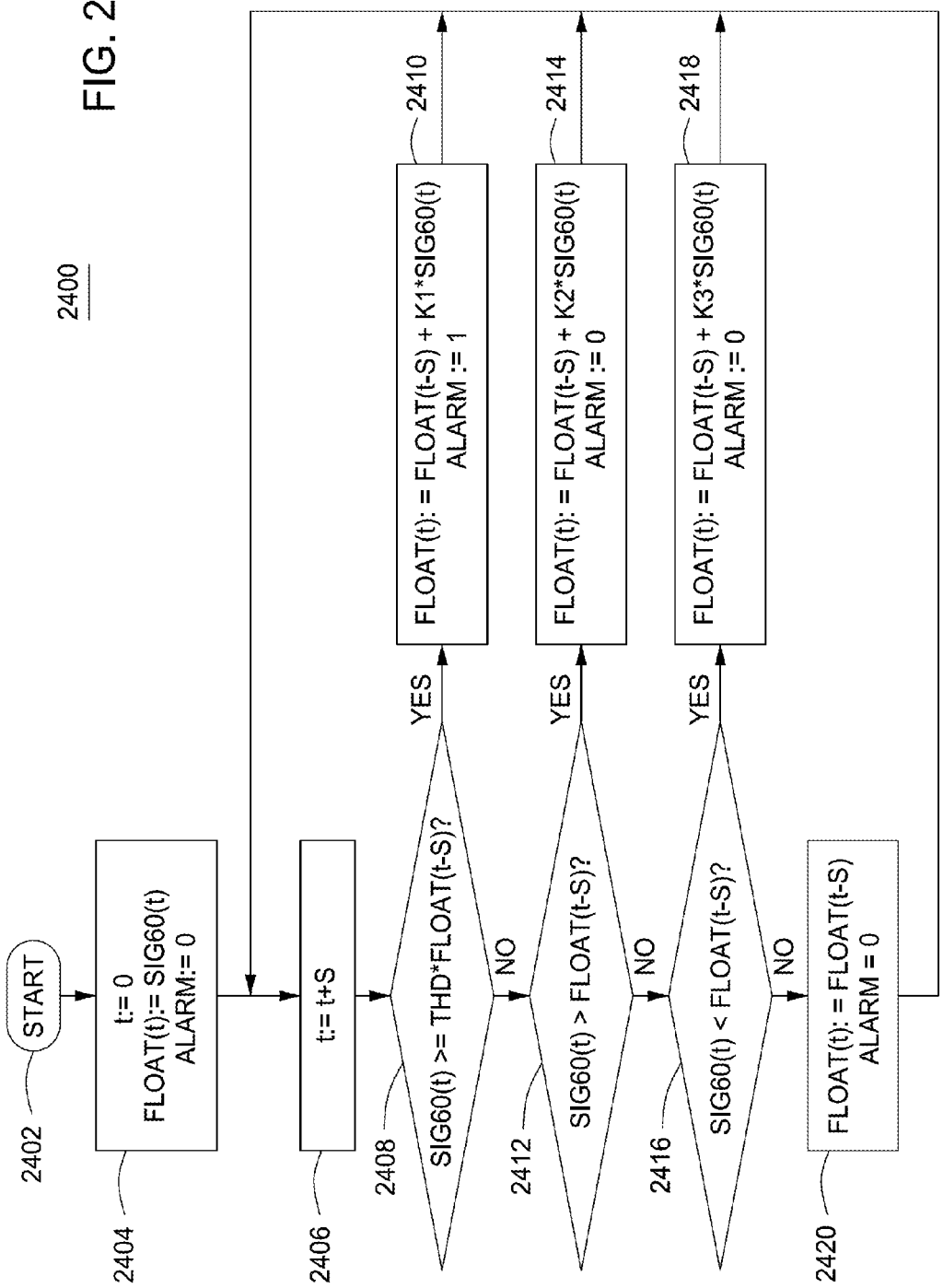
FIG. 24 is a schematic flow diagram illustrating a method for obtaining a running average and an alarm trigger in accordance with some embodiments of the present invention.

FIG. 24 is a schematic flow diagram illustrating a method 2400 for obtaining a running average (termed FLOAT) and alarm trigger (ALARM=1), in accordance with one embodiment of the present invention. A running average is difficult to calculate on a sample with an open ended number of data points, and calculating an average from the last N samples may not be satisfactory unless the number N is very large, which can impose undue demands on DSP 124 and memory 126.

Instead, a modified running average algorithm may be employed and is described in relation to the algorithm flowchart shown in FIG. 24, which also illustrates the conditions for activating the alarm condition (ALARM=1).

Method 2400 starts at 2402 with an initialization 2404 of time t, an average, represented by FLOAT(t), and the alarm value ALARM. For each time t thereafter (referred to as a "fresh time"), the time value or sample rate is updated 2406 by an increment value S that is related to speed, e.g., the output of wheel speed sensor 144. For example, the interval S may correspond to a ¼ revolution of wheel 146, e.g., four detections per wheel revolution. Thus, if the vehicle carrying system 100 moves faster, then the sampling time t=t+S becomes shorter and the averages and processing occurs more frequently. Conversely, if the vehicle moves more slowly, then the sampling time increases. The processing interval may be thought of as being fixed in space, rather than in time. This variable time interval implements the processing of sensed voltage data as a function of the speed of sensor system 100 to produce signals of the sort illustrated in FIGS. 23 and 23A.

When the probe is stopped, i.e. its speed is zero, no further calculation is made, which is not of concern because no additional voltage field data is being sensed that would need to be averaged. DPS 112 will continue to process stray voltage sensed by DSU 110 even if the DSU 110 is stopped. However, periodic comparisons 2408 of the present value of SIG 60 (*t*) could be made so that the alarm function 2410 remains operative in the event that a stray voltage appears during the time the DSU 110 is stopped.

For each fresh time t=t+S, the filtered and processed 60 Hz signal [SIG 60 (*t*)] produced by the Fast Fourier Transform described above is compared 2408 with the threshold above the previous average [THD*FLOAT(t−S)] of the previous time and if greater than or equal to the threshold (2408=YES), then the average [FLOAT(t)] is updated 2410 by adding the fresh value SIG 60 (*t*) adjusted by a weighting factor [K1] to the previous average [FLOAT(t−S)] and, because the threshold is exceeded, the alarm is set [ALARM=1] to cause an audible and/or visual alarm to be provided. If not (2420=NO), the fresh 60 Hz signal SIG 60 (*t*) is compared 2412 with the previous average [FLOAT(t−S)] and if greater (2412=YES), then the average [FLOAT (t−S)] is updated by adding the fresh value SIG 60 (*t*) adjusted by a weighting factor [K2] and the alarm remains not set [ALARM=0]. If not (2412=NO), the 60 Hz signal is compared 2416 with the previous average [FLOAT(t−S)] and if less (2416=YES), then the average [FLOAT(t−S)] is updated by subtracting the fresh value SIG 60 (*t*) adjusted by a weighting factor [K3] and the alarm remains not set [ALARM=0]. If none of the foregoing comparisons 2408, 2412, 2416 produces a YES condition, then the average [FLOAT(t)] remains 2420 the previous average [FLOAT(t−S)], alarm remains not set [ALARM=0], and the process is repeated (to 2406) for the next time increment t+S.

The constants K1, K2, K3 and THD depend on the background noise characteristics, the desired sensitivity of the discrimination, and the level of tolerable false alarms. Because it is not desirable that the relatively higher values of SIG 60 (*t*) when a stray voltage exceeding threshold is detected (2408=YES) cause the average FLOAT (which may represent background signals and noise) to increase correspondingly, a relatively lower scaling factor K1 is utilized under that condition. It also appears desirable that FLOAT increase less strongly for noise in excess of the average FLOAT than for noise less than the average FLOAT. Because large changes are weighted less than small changes, this selection of constants tends to produce a result that is akin to low-pass filtering, because the effect of large short-term changes is diminished. Analysis of available data suggests that values of weighting factors K1=0.002, K2=0.02, K3=0.04 and of the threshold factor THD=2.4 may be a reasonable starting point for an application involving sensing stray 60 Hz voltages in a utility service (e.g., street) environment.

Figure 25:
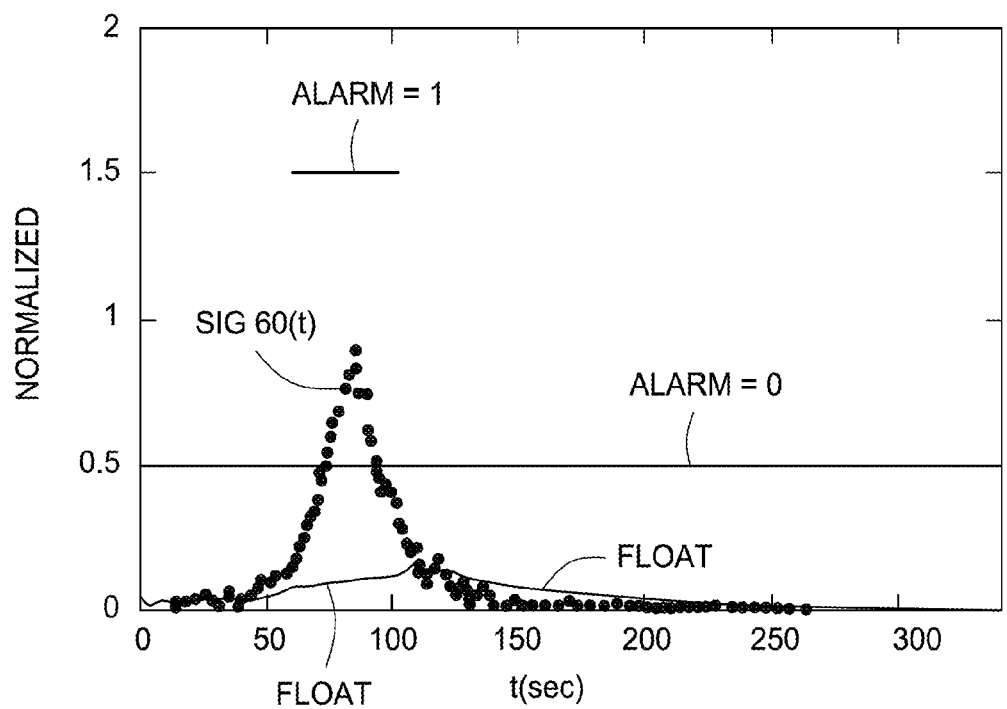
FIG. 25 is a graphical presentation of an example of data produced by the method for obtaining a running average and an alarm trigger in accordance with some embodiments of the present invention.

FIG. 25 is a graphical presentation of an example of data produced by the method 2400 described in relation to FIG. 24. The abscissa represents units of time t (or of distance) whereas the ordinate represents units of amplitude. Data points SIG 60 (*t*) represent the value of electric field sensed by DSU 110 versus time t as the sensor system 100 moves along a path. SIG 60 (*t*) exhibits a peak in the stray voltage in the region of values of about 60-100, and relatively low values both before and after the peak. The values of SIG 60 (*t*) are averaged (e.g., the FLOAT averaging as described above) and present as the graph line FLOAT which remains relatively low and stable (e.g., about 0.1 units) where no significant field is detected, but which increases in the region where a peak of the field SIG 60 (*t*) occurs. When the detected field value SIG 60 (*t*) exceeds the threshold, e.g., set at about 2.4 FLOAT, the high detected field value causes the alarm to change from no alarm [ALARM=0] to the alarm [ALARM=1] condition to produce an audio tone and/or visual indication thereof to the user.

As used herein, the term "about" means that dimensions, sizes, formulations, parameters, shapes and other quantities and characteristics are not and need not be exact, but may be approximate and/or larger or smaller, as desired, reflecting tolerances, conversion factors, rounding off, measurement error and the like, and other factors known to those of skill in the art. In general, a dimension, size, formulation, parameter, shape or other quantity or characteristic is "about" or "approximate" whether or not expressly stated to be such.

In addition to the embodiments described above, additional features may be provided, as desired. For example, a 60-Hz signal source located inside DSU 110 to couple a 60-Hz signal thereto could provide a self-test function, i.e when a self-test is performed by energizing the 60-Hz source. Sensor system 100 would then produce an audio indication, Log file, and/or other output, for a qualitative and/or quantitative test. Further, calibration and/or performance verification could be provided by DSU 110 and a commercially available accurate E-field measuring instrument at close range to a source of a relatively high field strength 60 Hz signal.

While the foregoing sensor, system, apparatus and method are described in terms of the 60 Hz electrical power system frequency common in the United States and other countries, the apparatus, arrangements and methods described herein are likewise applicable to the 50 Hz power systems of Europe and elsewhere, to the 400 Hz power systems for aircraft and other apparatus, to the 25 Hz power systems for transportation and other applications, and to power systems at any other frequency. Further, while the arrangement is often described in terms such as "stray voltage" and "voltage anomaly" and "stray voltage" field, it is noted that the electric field produced by the conditions so referred to is sensed and/or detected by the described arrangement.

While the foregoing is directed to embodiments of the present invention, other and further embodiments of the invention may be devised without departing from the basic scope thereof, and the scope thereof is determined by the claims that follow.

The invention claimed is:

1. A mobile apparatus mounted to a motor vehicle for identifying a hazardously energized object, the mobile apparatus comprising:
   one or more sensor probes that detect an electric field and provide an analog signal corresponding to the electric field;
   a signal converter for generating a digital signal from the analog signal;
   a signal processor to process the digital signal at the fundamental frequency pertaining to the hazardously energized object and to provide a second signal representing a magnitude of the electric field at the fundamental frequency;
   one or more audio devices configured to emit a continuous audio tone with variable pitch commensurate with a rise, peak and fall of the magnitude of the electric field when the mobile apparatus moves past the hazardously energized object at street level; and
   a display configured to display at least one of the analog signal or the second signal corresponding to the electric field, wherein at least a plot of the electric field over time is displayed.

2. The apparatus of claim 1, wherein parameters of the mobile apparatus are variable to account for background noise in the electric field and false alarms.

3. The apparatus of claim 1, wherein the signal converter is an analog to digital converter that digitizes the analog signal to provide a transformation of the analog signal, the transformation comprising a plurality of time domain samples, each sample representing an amplitude of the electric field.

4. The apparatus of claim 3, further comprising:
a signal processor that filters the plurality of time domain samples according to a desired frequency pertaining to the hazardously energized object and to provide a second signal representing a magnitude of the electric field at the desired frequency; and
wherein the apparatus further comprises a computer to receive the second signal and to provide an indication of the magnitude of the electric field at the desired frequency.

5. The apparatus of claim 4, wherein the plurality of time domain samples are subject, by the signal processor, to a filter to yield a frequency domain representation of the plurality of time domain samples.

6. The apparatus of claim 5, wherein the signal processor applies the filter on most recent digitized signals at a rate sufficient to produce the continuous audio tone with a pitch proportional to strength of the electric field.

7. The apparatus of claim 6, wherein the signal processor produces the continuous audio tone proportional to strength of the electric field.

8. The apparatus of claim 7, wherein the signal processor converts the plurality of time domain samples to a logarithmic scale.

9. The apparatus of claim 1, further comprising:
a support frame for mounting the one or more sensor probes to the motor vehicle.

10. The apparatus of claim 1, further comprising:
a computer, coupled to the one or more audio devices, that displays a graphical representation corresponding to the rise, peak and fall of the digital signal.

11. The apparatus of claim 10, further comprising:
a computer for capturing the rise, peak and fall to gather additional information to review a potentially hazardous object.

12. A method for detecting a hazardously energized object using a mobile apparatus, the method comprising:
moving the mobile apparatus;
detecting an electric field proximate the mobile apparatus using one or more sensor probes of the mobile apparatus that generate an analog signal corresponding to the electric field;
converting the analog signal into a digital signal;
processing the digital signal at the fundamental frequency pertaining to the hazardously energized object and providing a second signal representing a magnitude of the electric field at the fundamental frequency; and
emitting a continuous audio tone with a variable pitch commensurate with a rise, peak and fall of the second signal when the mobile apparatus moves past a hazardously energized object at street level,
displaying at least one of the analog signal or the second signal corresponding to the electric field, wherein at least a plot of the electric field over time is displayed.

13. The method of claim 12, further comprising:
adjusting parameters of the mobile apparatus according to background noise in the electric field and false alarms.

14. The method of claim 12, further comprising:
transforming the digital signal into a plurality of time domain samples, each sample representing magnitude of the electric field.

15. The method of claim 14, further comprising:
filtering the plurality of time domain samples according to a desired frequency pertaining to the hazardously energized object; and
receiving the second signal and providing an indication of the magnitude of the electric field at the desired frequency.

16. The method of claim 15 applying a filter to the plurality of time domain samples to yield a frequency domain representation of the plurality of time domain samples.

17. The method of claim 16 further comprising applying the filter on most recent digitized signals at a rate sufficient to produce the continuous audio tone proportional to strength of the electric field.

18. The method of claim 17, further comprising producing a continuous audio tone proportional to strength of the electric field.

19. The method of claim 18, further comprising converting the plurality of time domain samples to a logarithmic scale.

20. The method of claim 12, further comprising mounting the one or more sensor probes to the mobile apparatus via a support frame.

* * * * *